(12) United States Patent
Sugino et al.

(10) Patent No.: US 8,598,719 B2
(45) Date of Patent: Dec. 3, 2013

(54) SEMICONDUCTOR ELEMENT MOUNTING BOARD

(75) Inventors: Mitsuo Sugino, Utsunomiya (JP); Hideki Hara, Utsunomiya (JP); Toru Meura, Utsunomiya (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 77 days.

(21) Appl. No.: 12/997,376

(22) PCT Filed: Jun. 3, 2009

(86) PCT No.: PCT/JP2009/060194
§ 371 (c)(1),
(2), (4) Date: Dec. 10, 2010

(87) PCT Pub. No.: WO2009/150985
PCT Pub. Date: Dec. 17, 2009

(65) Prior Publication Data
US 2011/0084409 A1 Apr. 14, 2011

(30) Foreign Application Priority Data
Jun. 12, 2008 (JP) .................................. 2008-154713

(51) Int. Cl.
*H01L 23/48* (2006.01)
*H01L 23/52* (2006.01)
*H01L 29/40* (2006.01)

(52) U.S. Cl.
USPC ............ 257/783; 257/E23.018; 257/E21.514; 257/E23.023

(58) Field of Classification Search
USPC .......... 257/782–783, 785, E23.018, E23.166, 257/E21.514; 438/118, 119
See application file for complete search history.

(56) References Cited

U.S. PATENT DOCUMENTS 6,025,995 A * 2/2000 Marcinkiewicz ............. 361/760

2005/0130413 A1 * 6/2005 Shimoto et al. ............... 438/637
(Continued)

FOREIGN PATENT DOCUMENTS

| EP | 1758438 A2 | 2/2007 |
|---|---|---|
| JP | 7-297560 A | 11/1995 |

(Continued)

OTHER PUBLICATIONS

International Search Report for PCT/JP2009/060194, mailed on Jun. 30, 2009.

*Primary Examiner* — Daniel Luke
*Assistant Examiner* — Khaja Ahmad
(74) *Attorney, Agent, or Firm* — Birch, Stewart, Kolasch & Birch, LLP

(57) ABSTRACT

A semiconductor element mounting board includes: a board having surfaces; a semiconductor element provided at a side of one of the surfaces of the board; a bonding agent layer through which the board and the semiconductor element are bonded together, the bonding agent layer having a storage modulus at 25° C. of 5 to 1,000 MPa; a first layer into which the semiconductor element is embedded, the first layer provided on the one surface of the board; a second layer provided on the other surface of the board, the second layer being constituted from the same material as that of the first layer, the constituent material of the second layer having the same composition ratio as that of the constituent material of the first layer; and surface layers provided on the first and second layers, respectively, each of the surface layers being formed from at least a single layer. In the semiconductor element mounting board, a coefficient of thermal expansion of each surface layer in an inplane direction thereof measured based on JIS C 6481 at a temperature of 20° C. to a glass-transition temperature $Tg_a$° C., which is measured based on JIS C 6481, is 40 ppm/° C. or lower.

22 Claims, 3 Drawing Sheets

(56) References Cited

U.S. PATENT DOCUMENTS

| | | | |
|---|---|---|---|
| 2005/0208736 A1* | 9/2005 | Matsumura et al. | 438/460 |
| 2007/0026572 A1* | 2/2007 | Hatakeyama et al. | 438/113 |
| 2007/0052086 A1* | 3/2007 | Oi et al. | 257/698 |
| 2007/0119619 A1 | 5/2007 | Nakamura et al. | |
| 2007/0141759 A1 | 6/2007 | Nagase et al. | |
| 2009/0032976 A1 | 2/2009 | Misumi et al. | |
| 2009/0267212 A1* | 10/2009 | Wada et al. | 257/687 |
| 2010/0222435 A1* | 9/2010 | Oberegger et al. | 514/649 |
| 2010/0259910 A1* | 10/2010 | Hayashi et al. | 361/783 |

FOREIGN PATENT DOCUMENTS

| | | |
|---|---|---|
| JP | 2005-236039 A | 9/2005 |
| JP | 2006-261657 A | 9/2006 |
| JP | 2007-43184 A | 2/2007 |
| JP | 2007-59821 A | 3/2007 |
| JP | 2007-96260 A | 4/2007 |
| JP | 2007-173276 A | 7/2007 |

* cited by examiner

SEMICONDUCTOR ELEMENT MOUNTING BOARD

TECHNICAL FIELD

The present invention relates to a semiconductor element mounting board.

BACKGROUND ART

Electronic devices include a board on which semiconductor elements such as IC chips and capacitors are mounted.

Recently, electronic devices are downsized or high-functionalized, and therefore the number of the semiconductor elements to be mounted on a single board increases. This causes a problem that a sufficient mounting area of the semiconductor elements cannot be secured.

In order to solve such a problem, an attempt is made to secure a mounting area of semiconductor elements by embedding them into a semiconductor element mounting board (multilayer wiring board) so that an electronic device can be downsized (see, for example, patent document 1).

However, in the semiconductor element mounting board into which semiconductor elements are embedded, structures of upper and lower sides thereof become unsymmetric, and physical properties thereof also become unsymmetric. Because of this, there is a problem in that warpage is likely to occur in the board, so that reliability of the semiconductor element mounting board is lowered.

Patent document 1: JP-A 2005-236039

DISCLOSURE OF THE INVENTION

An object of the present invention is to provide a semiconductor element mounting board which can prevent occurrence of warpage thereof and prevent delamination of semiconductor elements mounted on the board.

In order to achieve such an object, the present invention includes the following features (1) to (20).

(1) A semiconductor element mounting board, comprising:
a board having surfaces;
a semiconductor element provided at a side of one of the surfaces of the board;
a bonding agent layer through which the board and the semiconductor element are bonded together, the bonding agent layer having a storage modulus at 25° C. of 5 to 1,000 MPa;
a first layer into which the semiconductor element is embedded, the first layer provided on the one surface of the board;
a second layer provided on the other surface of the board; and
surface layers provided on the first and second layers, respectively, each of the surface layers being formed from at least a single layer,
wherein a coefficient of thermal expansion of each surface layer in an inplane direction thereof measured based on JIS C 6481 at a temperature of 20° C. to a glass-transition temperature $Tg_a$° C., which is measured based on JIS C 6481, is 40 ppm/° C. or lower.

(2) The semiconductor element mounting board according to the above feature (1), wherein in the case where an average thickness of the board is defined as $T_1$ μm and an average thickness of the first layer is defined as $T_2$ μm/$T_1$ and $T_2$ satisfy a relation of $0.5 \leq T_2/T_1 \leq 3.0$.

(3) The semiconductor element mounting board according to the above feature (1), wherein an average thickness of the bonding agent layer is in the range of 5 to 50 μm.

(4) The semiconductor element mounting board according to the above feature (1), wherein in the case where an area of the first layer in a planar view thereof is defined as "100", an area of the semiconductor element in a planar view thereof is in the range of 6 to 10, and
wherein in the case where a volume of the first layer is defined as "100", a volume of the semiconductor element is in the range of 2 to 7.

(5) The semiconductor element mounting board according to the above feature (1), wherein the bonding agent layer is formed of a bonding agent, and the bonding agent comprises a resin composition containing (meth)acrylate copolymer, epoxy resin, phenol resin and an inorganic filler.

(6) The semiconductor element mounting board according to the above feature (1), wherein a glass-transition temperature of the bonding agent layer is in the range of 0 to 180° C.

(7) The semiconductor element mounting board according to the above feature (1), wherein a coefficient of thermal expansion of the first layer in an inplane direction thereof measured based on JIS C 6481 at a temperature of 20° C. to a glass-transition temperature $Tg_b$° C. thereof, which is measured based on JIS C 6481, is in the range of 25 to 50 ppm/° C.

(8) The semiconductor element mounting board according to the above feature (1), wherein a Young's modulus of the first layer at 25° C. is in the range of 2 to 10 GPa.

(9) The semiconductor element mounting board according to the above feature (1), wherein a glass-transition temperature $Tg_b$ of the first layer, which is measured based on JIS C 6481, is in the range of 100 to 250° C.

(10) The semiconductor element mounting board according to the above feature (1), wherein in the case where a Young's modulus of the surface layer at 25° C. is defined as X GPa and a Young's modulus of the first layer at 25° C. is defined as Y GPa, X and Y satisfy a relation of $0.5 \leq X-Y \leq 13$.

(11) The semiconductor element mounting board according to the above feature (1), wherein a Young's modulus of the surface layer at 25° C. is in the range of 4 to 15 GPa.

(12) The semiconductor element mounting board according to the above feature (1), wherein in the case where a coefficient of thermal expansion of the surface layer in an inplane direction thereof measured based on JIS C 6481 at a temperature of 20° C. to a glass-transition temperature $Tg_a$° C. thereof, which is measured based on JIS C 6481, is defined as A ppm/° C. and a coefficient of thermal expansion of the first layer in an inplane direction thereof measured based on JIS C 6481 at a temperature of 20° C. to a glass-transition temperature $Tg_b$° C. thereof, which is measured based on JIS C 6481, is defined as B ppm/° C., A and B satisfy a relation of $0.5 \leq B-A \leq 50$.

(13) The semiconductor element mounting board according to the above feature (1), wherein a glass-transition temperature $Tg_a$ of the surface layer, which is measured based on JIS C 6481, is in the range of 100 to 300° C.

(14) The semiconductor element mounting board according to the above feature (1), wherein a Young's modulus of the board at 25° C. is in the range of 20 to 50 GPa.

(15) The semiconductor element mounting board according to the above feature (1), wherein a coefficient of thermal expansion of the board in an inplane direction thereof measured based on JIS C 6481 at a temperature of 20° C. to a glass-transition temperature $Tg_c$° C. thereof, which is measured based on JIS C 6481, is 13 ppm/° C. or lower.

(16) The semiconductor element mounting board according to the above feature (1), wherein the surface layer is mainly composed of a resin material containing cyanate resin and an inorganic filler.

(17) The semiconductor element mounting board according to the above feature (16), wherein an amount of the resin material contained in the surface layer is in the range of 30 to 70 wt %.

(18) The semiconductor element mounting board according to the above feature (16), wherein an amount of the inorganic filler contained in the surface layer is in the range of 5 to 40 wt %.

(19) The semiconductor element mounting board according to the above feature (16), wherein the resin material further contains epoxy resin, and wherein in the case where an amount of the cyanate resin contained in the resin material is defined as C wt % and an amount of the epoxy resin contained in the resin material is defined as D wt %, C and D satisfy a relation of $0.5 \leq D/C \leq 4$.

(20) The semiconductor element mounting board according to the above feature (16), wherein the resin material further contains phenoxy resin, and wherein in the case where an amount of the cyanate resin contained in the resin material is defined as C wt % and an amount of the phenoxy resin contained in the resin material is defined as E wt %, C and E satisfy a relation of $0.2 \leq E/C \leq 2$.

BEST MODE FOR CARRYING OUT THE INVENTION

Hereinbelow, description will be made on a preferred embodiment of a semiconductor element mounting board according to the present invention.

<Semiconductor Element Mounting Board>

Figure 1:
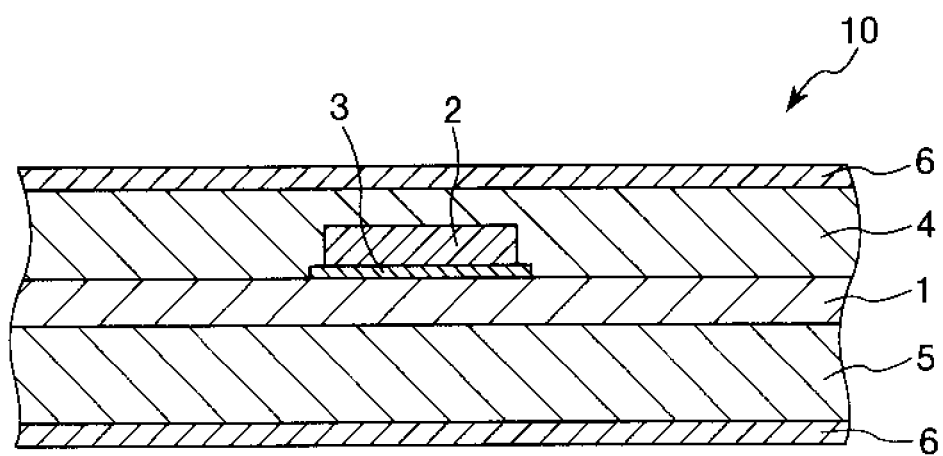
FIG. 1 is a longitudinal section showing a preferred embodiment of a semiconductor element mounting board according to the present invention.

FIG. 1 is a longitudinal section showing a preferred embodiment of the semiconductor element mounting board according to the present invention. In this regard, it is to be noted that hereinbelow, an upper side of FIG. 1 is referred to as "upper" or "upper side".

As shown in FIG. 1, the semiconductor element mounting board 10 includes a core board (substrate) 1, a semiconductor element 2 provided at an upper side of the core board 1, an bonding film (bonding agent layer) 3 through which the semiconductor element 2 is bonded to the core board 1, a first layer 4 formed so as to embed the semiconductor element 2 thereinto and provided on the upper surface of the core board 1, a second layer 5 provided on a lower surface of the core board 1, and surface layers 6, respectively, provided on the first layer 4 and the second layer 5.

Further, wiring circuits each having a predetermined pattern (which are not shown in FIG. 1) are formed on the core board 1, the first layer 4, the second layer 5 and the surface layers 6, respectively, and electrically connected to each other. Furthermore, the semiconductor element 2 is electrically connected to the wiring circuit provided on the surface layer 6.

[Core Board 1]

The core board 1 has a function of supporting the semiconductor element 2 mounted thereon through the bonding film 3.

Further, the core board 1 is composed of a material having a high dielectric property and high rigidity (Young's modulus).

Although the core board 1 may be composed of any materials each having the above properties, it is preferred that the core board 1 is mainly composed of a material containing a fiber base member, a resin material and an inorganic filler.

Examples of the fiber base member include: a glass fiber base member made of glass fibers such as a glass woven cloth or a glass non-woven cloth; a synthetic fiber base member formed from a woven or non-woven cloth mainly made of polyamide-based resin fibers (e.g., polyamide resin fibers, aromatic polyamide resin fibers and wholly aromatic polyamide resin fibers), polyester-based resin fibers (e.g., polyester resin fibers, aromatic polyester resin fibers and wholly aromatic polyester resin fibers), polyimide resin fibers or fluorocarbon resin fibers; a paper base member mainly formed from kraft paper, cotton linter paper or blended paper of linter and kraft pulp; and the like.

Among these fiber base members, the glass fiber base member is preferably used. By using such a glass fiber base member, it is possible to improve rigidity of the core board 1 and to reduce a thickness of the core board 1. In addition, it is also possible to lower a coefficient of thermal expansion of the core board 1.

This makes it possible to reduce occurrence of warpage of the semiconductor element mounting board 10 more effectively. As a result, it is possible to reduce stress which would be imparted to the mounted semiconductor element 2, thereby preventing occurrence of defects in the mounted semiconductor element 2.

Examples of glass for forming the glass fiber base member include E glass, C glass, A glass, S glass, D glass, NE glass, T glass, H glass, and the like. Among these glasses, the T glass is preferably used. By using such a T glass, it is possible to lower a coefficient of thermal expansion of the glass fiber base member. This makes it possible to lower the coefficient of thermal expansion of the core board 1.

Further, an amount (ratio) of the fiber base member contained in the core board 1 is preferably in the range of 30 to 70 wt %, and more preferably in the range of 40 to 60 wt %. This makes it possible to lower the coefficient of thermal expansion of the core board 1 more effectively.

A resin material constituting the core board 1 is not limited to a specific one, as long as it has a dielectric property. For example, as the resin material constituting the core board 1, the same one as a resin material constituting the surface layer 6 described below is preferably used. This makes it possible to lower a coefficient of thermal expansion of the core board 1 more effectively.

An amount of the resin material contained in the core board 1 is preferably in the range of 15 to 40 wt %, and more preferably in the range of 20 to 35 wt %. This makes it possible to make rigidity of the core board 1 high more effectively.

Further, examples of the inorganic filler include talc, alumina, glass, silica, mica, aluminum hydroxide, magnesium hydroxide, and the like.

An amount of the inorganic filler contained in the core board 1 is preferably in the range of 12 to 35 wt %, and more preferably in the range of 18 to 30 wt %. This makes it possible to make rigidity of the core board 1 high more effectively.

A Young's modulus of the core board 1 at 25° C. is preferably in the range of 20 to 50 GPa, and more preferably in the range of 25 to 40 GPa. This makes it possible to reduce occurrence of warpage of the semiconductor element mounting board 10 more effectively.

A Young's modulus of the core board 1 at 250° C. is preferably in the range of 10 to 45 GPa, and more preferably in the range of 13 to 35 GPa. By setting the Young's modulus to a value within the above range, the core board 1 can exhibit excellent rigidity when being heated. This makes it possible to reduce occurrence of warpage of the semiconductor element mounting board 10 more reliably, thereby improving reliability thereof.

A coefficient of thermal expansion of the core board 1 in an inplane direction thereof measured based on JIS C 6481 at a temperature of 20° C. to a glass-transition temperature $Tg_c$° C. thereof, which is measured based on JIS C 6481, is preferably 13 ppm/° C. or lower, and more preferably in the range of 3 to 11 ppm/° C. This makes it possible to reduce occurrence of warpage of the semiconductor element mounting board 10 further effectively, thereby reducing stress which would be imparted to the mounted semiconductor element 2.

An average thickness of the core board 1 is preferably in the range of 25 to 800 μm, and more preferably in the range of 40 to 200 μm.

[Semiconductor Element 2]

As shown in FIG. 1, the semiconductor element 2 is bonded to the core board 1 through the bonding film 3 described below.

Examples of the semiconductor element 2 include an IC chip, a capacitor, a diode, a transistor, a thyristor and the like.

In the case where an area of the first layer 4 described below in a planar view thereof is defined as "100", an area of the semiconductor element 2 in a planar view thereof is preferably in the range of 6 to 10, and more preferably in the range of 7 to 9. This makes it possible to prevent occurrence of warpage of the semiconductor element mounting board 10 at a normal temperature further effectively.

In this regard, in the case where the semiconductor element mounting board 10 has a plurality of semiconductor elements 2 therein, the area of the semiconductor element 2 means a sum of areas of the respective semiconductor elements 2 in a planar view thereof.

Further, in the case where a volume of the first layer 4 is defined as "100", a volume of the semiconductor element 2 is preferably in the range of 2 to 7, and more preferably in the range of 3 to 6. This also makes it possible to prevent occurrence of warpage of the semiconductor element mounting board 10 at a normal temperature further effectively.

In this regard, in the case where the semiconductor element mounting board 10 has a plurality of semiconductor elements 2 therein, the volume of the semiconductor element 2 means a sum of volumes of the respective semiconductor elements 2.

[Bonding Film (Bonding Agent Layer) 3]

The bonding film 3 has a function of bonding the semiconductor element 2 to the core board 1.

The semiconductor element mounting board 10 of the present invention is characterized in that the bonding film 3 has a storage modulus at 25° C. of 5 to 1,000 MPa. In the semiconductor element mounting board 10, there is a case that external force is imparted to the semiconductor element 2 due to a difference between dimensional changes of the respective layers which would occur depending on physical properties of the layers.

However, in the present invention, since the semiconductor element mounting board 10 includes the bonding film 3 having the above property, the bonding film 3 can absorb such external force which would be imparted to the semiconductor element 2. This makes it possible to prevent occurrence of defectives such as delamination of the semiconductor element 2 from the core board 1 and breakage of the semiconductor element 2 more effectively.

Further, a shape of the bonding layer 3 can be more reliably changed corresponding to dimensional change of the semiconductor element 2 which would occur due to variation of an external environment (usage environment) in temperature, humidity or the like. As a result, it is possible to prevent undesirable delamination of the semiconductor element 2 from the core board 1 more reliably.

In this regard, in the present invention, the storage modulus of the bonding film 3 at 25° C. is in the range of 5 to 1,000 MPa, but is preferably in the range of 8 to 700 MPa, and more preferably in the range of 100 to 700 MPa. By setting the storage modulus of the bonding film 3 at 25° C. to a value within the above range, the semiconductor element mounting board 10 can more remarkably exhibit the effects of the present invention.

The bonding film 3 is a flexible member mainly composed of a bonding agent (adhesive agent).

The bonding agent constituting the bonding film 3 is not limited to a specific type as long as it has the above property, but is preferably composed of a resin composition containing (meth)acrylate copolymer, epoxy resin, phenol resin and an inorganic filler.

The (meth)acrylate copolymer is a copolymer obtained by polymerizing (meth)acrylate monomers and other monomers, and is preferably (meth)acrylate based resin obtained by polymerizing acrylates or derivatives thereof as main monomers thereof.

Examples of the (meth)acrylate monomer include acrylate such as methyl acrylate or ethyl acrylate, methacrylate such as methyl methacrylate or ethyl methacrylate, and the like. Further, examples of the other monomer include acrylic acid, methacrylic acid, acrylonitrile, acrylamide and the like.

Further, the (meth)acrylate copolymer is preferably an acrylic acid copolymer obtained by polymerizing monomers each having an epoxy group, a hydroxyl group, a carboxyl group, a nitrile group or the like. By using such (meth)acrylate copolymer, it is possible to further improve a bonding strength of the semiconductor element 2 to the core board 1.

Concrete examples of the monomer having such a group include glycidyl methacrylate having the glycidyl group, hydroxyl methacrylate having the hydroxyl group, carboxyl methacrylate having the carboxyl group, acrylonitrile having the nitrile group, and the like.

Among them, it is preferable to use the (meth)acrylate copolymer obtained by polymerizing the monomers each having the carboxyl group. By using such (meth)acrylate copolymer, it is possible to promote curing of the bonding film 3, thereby obtaining a cured product of the bonding film 3 having a high glass-transition temperature in a shorter period of time.

From the viewpoint of producing a cured product having a high glass-transition temperature, an amount of the monomers each having the carboxyl group is preferably 0.5 wt % or more, and more preferably 1 wt % or more with respect to a total amount of the (meth)acrylate copolymer.

Further, from the viewpoint of further improving a storage stability of the bonding film 3, an amount of the monomers each having the carboxyl group is preferably 10 wt % or less, and more preferably 5 wt % or less with respect to a total amount of the (meth)acrylate copolymer.

A weight-average molecular weight of the (meth)acrylate copolymer is preferably 100,000 or more, and more preferably in the range of 150,000 to 1,000,000.

From the viewpoint of further improving workability by suppressing the bonding film 3 from having higher adhesiveness, a glass-transition temperature of the (meth)acrylate copolymer is preferably 0° C. or higher, and more preferably 5° C. or higher.

From the viewpoint of further improving adhesiveness of the bonding film 3 at a low temperature, the glass-transition temperature of the (meth)acrylate copolymer is preferably 30° C. or lower, and more preferably 20° C. or lower.

The epoxy resin may be a monomer, an oligomer or a polymer.

Concrete examples of the epoxy resin include: novolak type epoxy resin such as phenol novolak type epoxy resin or cresol novolak type epoxy resin; bisphenol type epoxy resin such as bisphenol A type epoxy resin or bisphenol F type epoxy resin; hydroquinone type epoxy resin; biphenyl type epoxy resin; stilbene type epoxy resin; triphenol methane type epoxy resin; triazine ring containing epoxy resin; dicyclopentadiene modified phenol type epoxy resin; naphthol type epoxy resin; aralkyl type epoxy resin such as phenol aralkyl type epoxy resin containing a phenylene chemical structure and/or a biphenylene chemical structure or naphthol aralkyl type epoxy resin containing a phenylene chemical structure and/or a biphenylene chemical structure; and the like.

Among them, it is preferable to use the novolak type epoxy resin, the bisphenol type epoxy resin, the biphenyl type epoxy resin, the naphthol type epoxy resin and the like. For example, by using the biphenyl type epoxy resin, it is possible to improve the glass-transition temperature of the bonding film 3, and to set an elastic modulus of the bonding film 3 to an appropriate value.

Further, by using the naphthol type epoxy resin, it is possible to improve the glass-transition temperature of the bonding film 3, and to improve the bonding strength (adhesiveness) of the bonding film 3 with respect to the semiconductor element 2 and the core board 1.

A softening point of the epoxy resin is not limited to a specific value as long as the epoxy resin has high compatibility with respect to the acrylate copolymer.

From the viewpoint of suppressing tackiness of the bonding film 3 and improving workability in the steps of manufacturing the semiconductor element mounting board 10, the softening point of the epoxy resin is preferably 40° C. or higher, and more preferably 50° C. or higher.

From the viewpoint of suppressing increase of a melt viscosity of the bonding film 3 and lowering of wettability of the melt thereof during a thermocompression bonding process due to the increase of the melt viscosity, and further improving the bonding strength of the bonding film 3, the softening point of the epoxy resin is preferably 100° C. or lower, and more preferably 90° C. or lower.

A plurality of components having different softening points may be used in combination as the epoxy resin. This makes it possible to easily obtain the effect of suppressing the tackiness of the bonding film 3 and the effect of suppressing the lowering of wettability of the melt thereof during the thermocompression bonding process at the same time. For example, a component having a softening point of 40° C. or higher but lower than 70° C. and a component having a softening point of 70° C. to 100° C. can be used in combination as the epoxy resin.

The phenol resin may be a monomer, an oligomer or a polymer which has at least two phenolic hydroxyl group capable of forming cross-linking chemical structures by a curing reaction with the epoxy resin.

Examples of the phenol resin include phenol novolak resin, cresol novolak resign, phenol aralkyl resin containing a phenylene chemical structure or a biphenylene chemical structure, naphthol aralkyl resin, triphenol methane resin, dicyclopentadiene type phenol resin, and the like. These phenol resins may be used singly or by mixture.

From the viewpoint of further improving heat resistance of the bonding film 3 and further suppressing generation of a decomposed gas from the bonding film 3 during a thermocompression bonding process, a softening point of the phenol resin is preferably 80° C. or higher, and more preferably 90° C. or higher.

Further, from the viewpoint of suppressing the increase of the melt viscosity of the bonding film 3 and the lowering of wettability of the melt thereof during the thermocompression bonding process due to the increase of the melt viscosity, and further improving the bonding strength of the bonding film 3, the softening point of the phenol resin is preferably 130° C. or lower, and more preferably 120° C. or lower.

An amount by weight of the (meth)acrylate copolymer contained in the resin composition is preferably lower than a total amount by weight of the epoxy resin and phenol resin contained in the resin composition. This makes it possible to effectively suppress the generation of the decomposed gas (outgas) from the bonding film 3 during the heat treatment in the thermocompression bonding process.

Therefore, for example, it is possible to suppress generation of voids when the semiconductor element 2 is bonded to the core board 1 through the bonding film 3, thereby improving the bonding strength of the bonding film 3 with respect to the semiconductor element 2 and the core board 1. Further, it is possible to suppress the core board 1 or the like from being contaminated due to the generation of the outgas.

From the viewpoint of further lowering a coefficient of thermal expansion of the bonding film 3, the amount of the epoxy resin contained in the resin composition is preferably 10 parts by weight or more, and more preferably 20 parts by weight or more with respect to 10 parts by weight of the (meth)acrylate copolymer.

Further, from the viewpoint of further improving toughness of the bonding film 3, the amount of the epoxy resin contained in the resin composition is preferably 100 parts by weight or less, and more preferably 50 parts by weight or less with respect to 10 parts by weight of the (meth)acrylate copolymer.

The amount of the phenol resin contained in the resin composition is set based on a ratio of an epoxy equivalent of the epoxy resin with respect to a hydroxyl equivalent of a phenol curing agent, that is, the phenol resin. The ratio is preferably in the range of 0.5 to 1.8, and more preferably in the range of 0.7 to 1.5. If the ratio is much lower, there is a case that the heat resistance of the bonding film 3 is lowered. On the other hand, if the ratio is much higher, there is a case that the storage stability of the bonding film 3 is lowered.

The inorganic filler has a function of lowering a coefficient of thermal expansion of the bonding film 3. Examples of the inorganic filler include silver, titanium oxide, silica, mica, and the like. Among them, the inorganic filler formed of the silica (hereinbelow, referred to as "silica filler") is preferably used. By using such a silica filler, it is possible to further improve workability in producing the bonding film 3. Examples of the silica filler include crushed silica and fused silica. As the silica filler, the fused silica is preferably used.

From the viewpoint of suppressing aggregation of particles of the inorganic filler within the bonding film 3 to thereby improve physical appearance thereof, an average particle size of the particles of the inorganic filler is preferably 0.01 μm or more, and more preferably 0.1 μm or more.

Further, from the viewpoint of further reliably suppressing the semiconductor element 2 from being broken by the inorganic filler protruding from the bonding film 3 during a thermocompression bonding process, the average particle size of the particles of the inorganic filler is preferably 20 μm or less, and more preferably 5 μm or less.

An amount of the inorganic filler contained in the resin composition is not limited to a specific value, but is preferably 1 part by weight or more, and more preferably 10 parts by weight or more with respect to 100 parts by weight of a resin component contained in the resin composition other than the inorganic filler.

This makes it possible to further lower the coefficient of thermal expansion of the bonding film 3, thereby reducing a difference between the coefficients of thermal expansion of the core board 1 and the bonding film 3. Therefore, it is possible to reduce the stress which would be imparted to the semiconductor element 2 due to thermal shock, thereby further reliably suppressing the delamination of the semiconductor element 2 from the core board 1.

Further, the amount of the inorganic filler contained in the resin composition is preferably 200 parts by weight or less, and more preferably 100 parts by weight or less with respect to 100 parts by weight of the resin component contained in the resin composition other than the inorganic filler.

If the amount of the inorganic filler contained in the resin composition is too large, there is a case that the coefficient of thermal expansion of the bonding film 3 is lowered, whereas an elastic modulus of the bonding film 3 is needlessly increased. On the other hand, if the amount of the inorganic filler contained in the resin composition is set below the upper limit value, it is possible to further improve the bonding strength of the bonding film 3 with respect to the semiconductor element 2 and the core board 1.

In this regard, it is to be noted that the resin composition constituting the bonding film 3 may contain the other components in addition to the above mentioned components.

The resin composition may contain a coupling agent. This makes it possible to further improve bonding strength of the resin contained in the resin composition with respect to objects to be bonded to the bonding film 3 (that is, the semiconductor element 2 and the core board 1), and adhesiveness between the resin and the inorganic filler (silica) contained in the resin composition in an interface therebetween.

Examples of the coupling agent include a silane type coupling agent, a titanium type coupling agent, an aluminum type coupling agent, and the like. Among them, the silane type coupling agent is preferably used.

Examples of the silane type coupling agent include vinyl trichlorosilane, vinyl trimethoxysilane, vinyl triethoxysilane, β-(3,4-epoxycyclohexyl)ethyl trimethoxysilane, γ-glycidoxypropyl trimethoxysilane, γ-glycidoxypropyl methyl dimethoxysilane, γ-methacryloxypropyl trimethoxysilane, γ-methacryloxypropyl methyl diethoxysilane, γ-methacryloxypropyl triethoxysilane, N-β-(aminoethyl) γ-aminopropyl methyl dimethoxysilane, N-β-(aminoethyl) γ-aminopropyl trimethoxysilane, N-β-(aminoethyl)γ-aminopropyltriethoxysilane, γ-aminopropyl trimethoxysilane, γ-aminopropyl triethoxysilane, N-phenyl γ-aminopropyl trimethoxysilane, γ-chloropropyl trimethoxysilane, γ-mercaptopropyl trimethoxysilane, 3-isocyanatepropyl triethoxysilane, 3-acryloxypropyl trimethoxysilane, and the like.

From the viewpoint of further improving the above bonding strength or adhesiveness, an amount of the coupling agent contained in the resin composition is preferably 0.01 part by weight or more, and more preferably 0.1 part by weight or more with respect to 100 parts by weight of the whole resin composition.

On the other hand, from the viewpoint of suppressing generation of a decomposed gas (outgas) or voids, the amount of the coupling agent contained in the resin composition is preferably 10 parts by weight or less, and more preferably 5 parts by weight or less with respect to 100 parts by weight of the whole resin composition.

Further, the resin composition constituting the bonding film 3 may contain a flux-active compound having a carboxyl group and/or a phenolic hydroxyl group in addition to the above mentioned components.

The flux-active compound (compound having flux activity) refers to a compound having one or more of a carboxyl group and/or a phenolic hydroxyl group in a molecule thereof. Such a flux-active compound may be in the form of a liquid or a solid.

Examples of the flux-active compound having the carboxyl group include an aliphatic acid anhydride, an alicyclic acid anhydride, an aromatic acid anhydride, an aliphatic carboxylic acid, an aromatic carboxylic acid and the like. Further, examples of the flux-active compound having the phenolic hydroxyl group include phenols.

Examples of the aliphatic acid anhydride include succinic acid anhydride, polyadipic acid anhydride, polyazelaic acid anhydride, polysebacic acid anhydrate, and the like.

Examples of the alicyclic acid anhydride include methyl tetrahydrophthalic acid anhydride, methyl hexahydrophthalic acid anhydride, methyl himic acid anhydride, hexahydrophthalic acid anhydride, tetrahydrophthalic acid anhydride, trialkyl tetrahydrophthalic acid anhydride, methyl cyclohexene dicarboxylic acid anhydride, and the like.

Examples of the aromatic acid anhydride include phthalic acid anhydride, trimellitic acid anhydride, pyromellitic acid dianhydride, benzophenone tetracarboxylic acid anhydrate, ethylene glycol bistrimellitate, glycerol tristrimellitate, and the like.

Examples of the aliphatic carboxylic acid include a compound represented by $HOOC-(CH_2)_n-COOH$. In this regard, "n" is an integer of 0 to 20.

From the viewpoint of appropriately maintaining the flux activity of the compound represented by $HOOC-(CH_2)_n-COOH$, suppressing generation of an outgas from the bonding film 3 during a bonding process, and keeping a balance between an elastic modulus and a glass-transition temperature of the bonding film 3 after being cured, "n" is preferably in the range of 3 to 10.

By setting "n" to 3 or more, it is possible to suppress increase of the elastic modulus of the bonding film 3 after being cured, thereby improving the bonding strength thereof with respect to the semiconductor element 2 and the core board 1. On the other hand, by setting "n" to 10 or less, it is possible to suppress decrease of the elastic modulus of the bonding film 3 after being cured, thereby improving connection reliability of the semiconductor element mounting board 10.

Examples of the compound represented by $HOOC-(CH_2)_n-COOH$ include glutaric acid ("n"=3: $HOOC-(CH_2)_3-COOH$), adipic acid ("n"=4: $HOOC-(CH_2)_4-COOH$), pimelic acid ("n"=5: $HOOC-(CH_2)_5-COOH$), sebacic acid ("n"=8: $HOOC-(CH_2)_8-COOH$), $HOOC-(CH_2)_{10}-COOH$ ("n"=10), and the like.

Examples of another aliphatic carboxylic acid include formic acid, acetic acid, propionic acid, butyric acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid, succinic acid, and the like.

Examples of the aromatic carboxylic acid include benzoic acid, phthalic acid, isophthalic acid, terephthalic acid, hemimellitic acid, trimellitic acid, trimesic acid, mellophanic acid, prehnitic acid, pyromellitic acid, mellitic acid, triilic acid, xylic acid, hemelitic acid, mesitylenic acid, prehnitylic acid, toluic acid, cinnamic acid, salicylic acid, 2,3-dihydroxybenzoic acid, 2,4-dihydroxybenzoic acid, gentisic acid (2,5-dihydroxybenzoic acid), 2,6-dihydroxybenzoic acid, 3,5-dihydroxybenzoic acid, gallic acid (3,4,5-trihydroxybenzoic acid), naphthoic acid derivatives such as 1,4-dihydroxy-2-naphthoic acid and 3,5-dihydroxy-2-naphthoic acid, phenol phthalin, diphenolic acid, and the like.

Examples of the flux-active compound having the phenolic hydroxyl group include phenols. Specifically, examples of the phenols include monomers each having a phenolic hydroxyl group such as phenol, o-cresol, 2,6-xylenol, p-cresol, m-cresol, o-ethyl phenol, 2,4-xylenol, 2,5-xylenol, m-ethyl phenol, 2,3-xylenol, meditol, 3,5-xylenol, p-tertiarybutyl phenol, catechol, p-tertiaryamyl phenol, resorcinol, p-octyl phenol, p-phenyl phenol, bisphenol A, bisphenol F, bisphenol AF, biphenol, diallyl bisphenol F, diallyl bisphenol A, trisphenol, tetrakisphenol and the like, phenol novolak resin, o-cresol novolak resin, bisphenol F novolak resin, bisphenol A novolak resin and the like.

It is preferred that the flux-active compound is a compound having at least two phenolic hydroxyl groups in one molecule thereof. This is because such a compound can produce a three-dimensional chemical structure by reacting with a thermosetting resin such as epoxy resin and be introduced into the three-dimensional chemical structure. Further, such a compound further has at least one carboxyl group directly bonded to an aromatic ring capable of exhibiting a flux action with respect to a metal oxide film in one molecule thereof.

Examples of such a flux-active compound include: benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid and gallic acid (3,4,5-trihydroxybenzoic acid); naphthoic acid derivatives such as 1,4-dihydroxy-2-naphthoic acid, 3,5-dihydroxy-2-naphthoic acid and 3,7-dihydroxy-2-naphthoic acid; phenol phthalin; diphenolic acid; and the like.

One or more of these flux-active compounds may be used singularly or in combination.

From the viewpoint of improving a flux activity of the bonding film 3, an amount of the flux-active compound contained in the resin composition is preferably 1 wt % or more, and more preferably 5 wt % or more with respect to a total amount of the components contained in the resin composition (bonding film 3). Further, the amount of the flux-active compound contained in the resin composition is preferably 30 wt % or less, and more preferably 25 wt % or less.

A coefficient of thermal expansion of the bonding film 3 in an inplane direction thereof measured based on JIS C 6481 at a temperature of 20° C. to a glass-transition temperature $Tg_a$° C. thereof, which is measured based on JIS C 6481, is preferably in the range of 30 to 300 ppm/° C., and more preferably in the range of 500 to 160 ppm/° C.

By setting the coefficient of thermal expansion to a value within the above range, a shape of the bonding film 3 can be changed depending on dimensional change of the semiconductor element 2 more reliably. As a result, it is possible to prevent undesirable delamination of the semiconductor element 2 from the core board 1 more reliably.

A glass-transition temperature of the bonding film 3 is preferably in the range of about 0 to 180° C., and more preferably in the range of about 10 to 150° C. This makes it possible to set the storage modulus of the bonding film 3 to a more appropriate value, thereby preventing the occurrence of warpage of the semiconductor element mounting board 10 more reliably. As a result, it is possible to prevent the undesirable delamination of the semiconductor element 2 from the core board 1 and the occurrence of defects such as crack of the semiconductor element 2 more reliably.

An average thickness of the bonding film 3 (bonding agent layer) is preferably in the range of 5 to 50 µm, and more preferably in the range of 10 to 40 µm. This makes it possible to absorb the above mentioned external force which would be imparted to the semiconductor element 2 more effectively. Therefore, it is possible to prevent the undesirable delamination of the semiconductor element 2 from the core board 1 and the occurrence of defects such as crack of the semiconductor element 2 more reliably.

[First Layer 4 and Second Layer 5]

As shown in FIG. 1, the first layer 4 formed so as to embed the above-mentioned semiconductor element 2 thereinto and the second layer 5 are provided on both surfaces of the core board 1, respectively.

The first layer 4 and the second layer 5 preferably have equal physical properties (e.g. coefficients of thermal expansion, Young's moduluses), and they are more preferably formed of materials containing the same components in the same ratios. This makes it possible to make warpage of the semiconductor element mounting board 10 which would occur due to change of an external environment very small.

Such first layer 4 and second layer 5 are composed of resin materials having high dielectric properties.

The resin material constituting the first layer 4 (second layer 5) is not limited to a specific one, as long as it has the high dielectric property. As the resin material constituting the first layer 4 (second layer 5), the same resin material constituting the surface layer 6 which will be described below can be used.

By constituting the first layer 4 (second layer 5) from the same resin material constituting the surface layer 6, it is possible to further improve adhesiveness between the first layer 4 (second layer 5) and the surface layer 6, thereby preventing delamination therebetween.

Further, the first layer 4 (second layer 5) can have a coefficient of thermal expansion close to that of copper which is a material constituting a conductive circuit provided between the first layer 4 (second layer 5) and the surface layer 6. Therefore, it is possible to reduce stress which would occur at an interface between the first layer 4 (second layer 5) and the conductive circuit constituted from the copper. This makes it possible to obtain an effect of maintaining an excellent electrical conductive property of the conductive circuit.

A coefficient of thermal expansion of the first layer 4 (second layer 5) in an inplane direction thereof measured based on JIS C 6481 at a temperature of 20° C. to a glass-transition temperature $Tg_b$° C. thereof, which is measured based on JIS C 6481, is preferably in the range of 25 to 50 ppm/° C., and more preferably in the range of 30 to 46 ppm/° C.

This makes it possible to prevent delamination of the semiconductor element 2 from the core board 1 more effectively and to reduce occurrence of warpage of the semiconductor element mounting board 10 more effectively.

Further, the glass-transition temperature $Tg_b$ of the first layer 4 (second layer 5), which is measured based on JIS C 6481, is preferably in the range of 190 to 300° C., and more preferably in the range of 230 to 280° C. This makes it possible to reduce the occurrence of warpage of the semiconductor element mounting board 10 and to make heat resistance of the semiconductor element mounting board 10 higher.

Furthermore, a Young's modulus of the first layer 4 (second layer 5) at 25° C. is preferably in the range of 2 to 10 GPa, and more preferably in the range of 3 to 7 GPa. By setting the Young's modulus of the first layer 4 (second layer 5) at 25° C. to a value within the above range, the first layer 4 and the second layer 5 can absorb force which would occur when the semiconductor element mounting board 10 warps as whole. This also makes it possible to reduce occurrence of warpage of the semiconductor element mounting board 10 more effectively.

In addition, by setting the Young's modulus of the first layer 4 at 25° C. to a value within the above range, even in the case where dimensional change of the first layer 4 occurs depending on change of external environment, it is possible to lower an effect of such change on the semiconductor element 2. As a result, it is possible to prevent undesirable delamination of the semiconductor element 2 from the core board 1 more effectively.

In the case where an average thickness of the first layer 4 is defined as $T_2$ μm and an average thickness of the core board 1 is defined as $T_1$ μm and, $T_1$ and $T_2$ satisfy preferably a relation of $0.5 \leq T_2/T_1 \leq 2.0$, and more preferably a relation of $1 \leq T_2/T_1 \leq 1.5$. By satisfying such a relation, the first layer 4 can have a relatively thin thickness. This makes it possible to make an effect on the semiconductor element 2 smaller due to dimensional change of the first layer 4. Therefore, it is possible to prevent undesirable delamination of the semiconductor element 2 from the core board 1 more effectively.

Further, since the thickness of the first layer 4 becomes enough smaller than that of the core board 1, the core board 1 and the surface layer 6 can sufficiently lower an effect on warpage of the semiconductor element mounting board 10 due to the dimensional change of the first layer 4. This makes it possible to reduce occurrence of warpage of the semiconductor element mounting board 10 more effectively.

Specifically, the average thickness of the first layer 4 (second layer 5) is preferably in the range of 30 to 800 μm, and more preferably in the range of 50 to 200 μm.

[Surface Layer 6]

One surface layer 6 is formed on the first layer 4 and the other surface layer 6 is formed below the second layer 5.

The semiconductor element mounting board 10 of present invention is also characterized in that a coefficient of thermal expansion of each surface layer 6 in an inplane direction thereof measured based on JIS C 6481 at a temperature of 20° C. to a glass-transition temperature $Tg_a$° C., which is measured based on JIS C 6481, is 40 ppm/° C. or lower.

The surface layer 6 having such a property becomes difficult to dimensionally change even if an external environment such as outside air temperature or outside air humidity changes. This makes it possible to suppress dimensional change of the semiconductor element mounting board 10 which would occur due to a structure thereof and a difference between physical properties of the respective layers. As a result, it is possible to prevent occurrence of warpage of the semiconductor element mounting board 10.

Further, since the semiconductor element 2 is bonded to the core board 1 through the above mentioned bonding film 3 (bonding agent layer), it is possible to prevent the undesirable delamination of the semiconductor element 2 from the core board 1 more effectively by the synergy effect of providing the bonding film 3 and the surface layers 6.

In this regard, in the present invention, the coefficient of thermal expansion of the surface layer 6 in the inplane direction thereof measured based on JIS C 6481 at the temperature of 20° C. to the glass-transition temperature $Tg_a$° C., which is measured based on JIS C 6481, is 40 ppm/° C. or lower, but is preferably in the range of 3 to 30 ppm/° C. By setting the coefficient of thermal expansion of the surface layer 6 to a value within the above range, the semiconductor element mounting board 10 can more remarkably exhibit the effects of the present invention.

On the other hand, if the above mentioned coefficient of thermal expansion of the surface layer 6 is too large, it is impossible to suppress the dimensional change of the semiconductor element mounting board 10 which would occur due to the structure thereof and the difference between the physical properties of the respective layers. This makes it impossible to prevent the occurrence of warpage of the semiconductor element mounting board 10.

Further, it becomes difficult for the bonding film 3 to absorb the warpage of the semiconductor element mounting board 10. This causes the undesirable delamination of the semiconductor element 2 from the core board 1 and the occurrence of cracks in the semiconductor element 2. As a result, reliability of the semiconductor element mounting board 10 is lowered.

It is preferred that each surface layer 6 has rigidity higher than that of each of the first layer 4 and the second layer 5. By providing such a surface layer 6 having relatively high rigidity, it is possible to more reliably suppress the dimensional change of the semiconductor element mounting board 10 which would occur due to the structure thereof and the difference between the physical properties of the respective layers. This makes it possible to more reliably prevent the occurrence of warpage of the semiconductor element mounting board 10.

As described above, the surface layer 6 has preferably the rigidity higher than that of the first layer 4 (second layer 5). Specifically, in the case where a Young's modulus of the surface layer 6 at 25° C. is defined as X GPa and the Young's modulus of the first layer 4 at 25° C. is defined as Y GPa, X and Y preferably satisfy more preferably a relation of $0.5 \leq X-Y \leq 13$, and even more preferably a relation of $3 \leq X-Y \leq 8$. This makes it possible to further improve the effects of the present invention described above.

The Young's modulus of the surface layer 6 at 25° C. is preferably in the range of 4 to 20 GPa, and more preferably in the range of 5 to 15 GPa. This makes it possible to reduce the occurrence of warpage of the semiconductor element mounting board 10 more effectively.

Further, in the case where the coefficient of thermal expansion of the surface layer 6 in the inplane direction thereof measured based on JIS C 6481 at the temperature of 20° C. to the glass-transition temperature $Tg_a$° C. thereof, which is measured based on JIS C 6481, is defined as A ppm/° C. and the coefficient of thermal expansion of the first layer 4 (second layer 5) in the inplane direction thereof measured based on JIS C 6481 at the temperature of 20° C. to the glass-transition temperature $Tg_b$° C. thereof, which is measured based on JIS C 6481, is defined as B ppm/° C., A and B preferably satisfy a relation of $0.5 \leq B-A \leq 50$, and more preferably satisfy a relation of $5 \leq B-A \leq 40$.

By setting A and B to such a relation, it is possible to prevent the delamination of the semiconductor element 2 from the core board 1 more reliably and to reduce the occurrence of warpage of the semiconductor element mounting board 10 more reliably.

The glass-transition temperature $Tg_a$ of the surface layer 6, which is measured based on JIS C 6481, is preferably in the range of 190 to 300° C., and more preferably in the range of 230 to 280° C. This makes it possible to reduce the occurrence of warpage of the semiconductor element mounting board 10 and to make heat resistance of the semiconductor element mounting board 10 higher.

Although a resin material constituting the surface layer 6 is not limited to a specific one, but preferably contains, for example, a thermosetting resin. This makes it possible to improve heat resistance of the surface layer 6.

Examples of the thermosetting resin include: phenolic resin such as novolak type phenolic resin (e.g., phenol novolak resin, cresol novolak resin, bisphenol A novolak resin), or resol type phenolic resin (e.g., non-modified resol phenolic resin, oil-modified resol phenolic resin modified with oil such as wood oil, linseed oil or walnut oil); epoxy resin such as bisphenol type epoxy resin (e.g., bisphenol A epoxy resin, bisphenol F epoxy resin), novolak type epoxy resin (e.g., novolak epoxy resin, cresol novolak epoxy resin), or biphenyl type epoxy resin; cyanate resin; urea resin; triazine ring-containing resin such as melamine resin; unsaturated polyester resin; bismaleimide resin; polyurethane resin; diallylphthalate resin; silicone resin; benzoxazine ring-containing resin; cyanate ester resin; and the like.

Among these thermosetting resins, the cyanate resin is more preferably used. By using such cyanate resin, it is possible to lower the coefficient of thermal expansion of the surface layer 6. In addition, it is also possible to improve the heat resistance of the surface layer 6.

The cyanate resin can be obtained by, for example, thermally curing a prepolymer produced using a method of reacting cyanogen halide and phenol with each other, and then optionally heating them. Specifically, examples of such cyanate resin include novolak type cyanate resin, bisphenol type cyanate resin such as bisphenol A type cyanate resin, bisphenol E type cyanate resin or tetramethyl bisphenol F type cyanate resin, and the like.

Among these cyanate resins, the novolak type cyanate resin is preferably used. By using the novolak type cyanate resin, it is possible to further improve the heat resistance and flammability of the surface layer 6 due to increase of a crosslinking density of the resin material in the surface layer 6. This is because the novolak type cyanate resin has triazine rings and because it has a high content of benzene rings due to its structure, thereby easily carbonizing the benzene rings contained therein.

In addition, by using the novolak type cyanate resin, it is also possible to impart excellent rigidity to the surface layer 6, even in the case where the surface layer 6 has a reduced thickness (e.g., 35 μm or less). The surface layer 6 offers excellent rigidity particularly upon heating, and therefore the surface layer 6 makes it possible to reduce the occurrence of warpage of the semiconductor element mounting board 10 more reliably and to improve reliability of the semiconductor element mounting board 10.

As the prepolymer of the novolak type cyanate resin, one represented by, for example, the following formula (I) can be used.

[Formula 1]

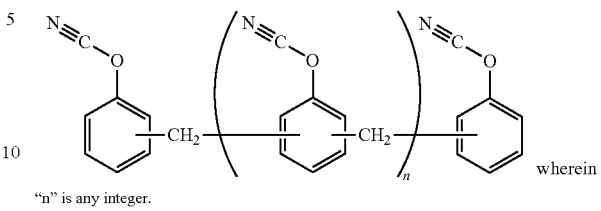

formula (I)

"n" is any integer.

An average number of repeating units "n" of the prepolymer of the novolak type cyanate resin represented by the above formula (I) is not limited to a specific value, but is preferably in the range of 1 to 10, and more preferably in the range of 2 to 7.

If the average number of the repeating units "n" is less than the above lower limit value, the novolak type cyanate resin tends to be crystallized, thereby relatively lowering solubility of the novolak type cyanate resin in common solvents. As a result, there is a case that it is difficult to handle the novolak type cyanate resin.

On the other hand, if the average number of the repeating units "n" exceeds the above upper limit value, a melt viscosity of the resin material becomes too high, and therefore there is a case that forming efficiency (moldability) of the surface layer 6 is lowered.

A weight-average molecular weight of the prepolymer of the cyanate resin is not limited to a specific value, but is preferably in the range of 500 to 4,500, and more preferably in the range of 600 to 3,000.

In this regard, it is to be noted that the weight-average molecular weight of a resin material such as cyanate resin, a prepolymer or the like can be measured using, for example, a GPC (gel permeation chromatography).

The GPC measurement is carried out by, for example, using HLC-8200GPC (produced by TOSOH CORPORATION) as measurement equipment, TSK=GEL polystyrene as a column and THF (tetrahydrofuran) as a solvent.

An amount of the cyanate resin contained in the surface layer 6 is not limited to a specific value, but is preferably in the range of 1 to 20 wt %, and more preferably in the range of 3 to 15 wt %. If the amount of the cyanate resin is less than the above lower limit value, there is a case that it becomes difficult to form the surface layer 6. On the other hand, if the amount of the cyanate resin exceeds the above upper limit value, there is a case that mechanical strength of the surface layer 6 is lowered.

Further, in the case where the cyanate resin (especially, novolak type cyanate resin) is used as the thermosetting resin, an epoxy resin containing substantially no halogen atom is preferably used in combination with the cyanate resin.

Examples of the epoxy resin include phenol novolak type epoxy resin, bisphenol type epoxy resin, naphthalene type epoxy resin, aryl alkylene type epoxy resin, and the like. Among these epoxy resins, the aryl alkylene type epoxy resin is preferably used. By using such an aryl alkylene type epoxy resin, it is possible to further improve thermal resistance of moisture absorbed solder and flammability of the surface layer 6.

The aryl alkylene type epoxy resin is an epoxy resin having one or more aryl alkylene groups in one repeating unit. Examples of such an aryl alkylene type epoxy resin include xylylene type epoxy resin, biphenyl dimethylene type epoxy resin, and the like. Among these aryl alkylene type epoxy resins, the biphenyl dimethylene type epoxy resin is preferably used. A prepolymer of the biphenyl dimethylene type epoxy resin can be represented by, for example, the following formula (II).

[Formula 2]

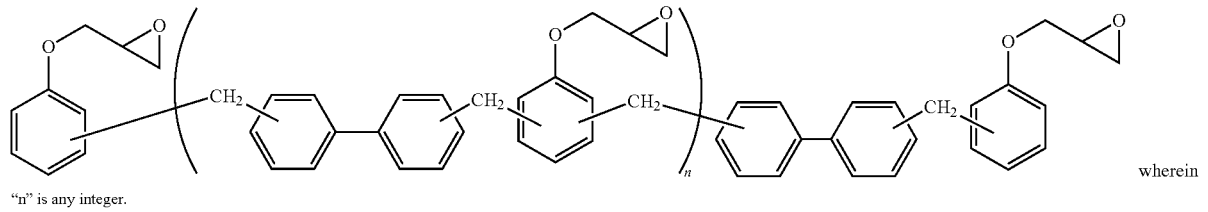

formula (II)

wherein "n" is any integer.

An average number of repeating units "n" of the prepolymer of the biphenyl dimethylene type epoxy resin represented by the above formula (II) is not limited to a specific value, but is preferably in the range of 1 to 10, and more preferably in the range of 2 to 5.

If the average number of the repeating units "n" is less than the above lower limit value, the biphenyl dimethylene type epoxy resin tends to be crystallized, thereby lowering solubility of the biphenyl dimethylene type epoxy resin in common solvents. As a result, there is a case that it becomes difficult to handle the biphenyl dimethylene type epoxy resin.

On the other hand, if the average number of the repeating units "n" exceeds the above upper limit value, there is a case that flowability of the resin material is lowered, thereby causing defective molding of the surface layer 6 and the like.

An amount of the cyanate resin contained in the resin material is defined as C wt % and an amount of the epoxy resin contained in the resin material is defined as D wt %, C and D preferably satisfy a relation of $0.5 \leq D/C \leq 4$, and more satisfy a relation of $1 \leq D/C \leq 3$. This makes it possible to improve the heat resistance of the surface layer 6 and to make the coefficient of thermal expansion of the surface layer 6 especially lower.

The amount of the epoxy resin contained in the surface layer 6 is not limited to a specific value, but is preferably in the range of 3 to 25 wt %, and more preferably in the range of 5 to 20 wt %. If the amount of the epoxy resin is less than the above lower limit value, there is a case that reactivity of the prepolymer of the cyanate resin and water absorption of the surface layer 6 (obtained product) are lowered. On the other hand, if the amount of the epoxy resin exceeds the above upper limit value, there is a case that the heat resistance of the surface layer 6 is lowered.

A weight-average molecular weight of the prepolymer of the epoxy resin is not limited to a specific value, but is preferably in the range of 500 to 20,000, and more preferably in the range of 800 to 15,000.

Further, in the case where the cyanate resin (especially, novolak type cyanate resin) is used as the thermosetting resin, a phenoxy resin containing substantially no halogen atom is preferably used in combination with the cyanate resin. This makes it possible to improve forming efficiency (moldability) of the resin material when preparing a metal foil with resin or a dielectric sheet with base member. In this regard, "substantially no halogen atom" means that an amount of halogen atoms contained in the phenoxy resin is 1 wt % or less.

Examples of the phenoxy resin include, but are not limited to, phenoxy resin having bisphenol chemical structures, phenoxy resin having novolak chemical structures, phenoxy resin having naphthalene chemical structures, phenoxy resin having biphenyl chemical structures, and the like. Alternatively, phenoxy resin having two or more kinds of these chemical structures may also be used.

Among these phenoxy resins, phenoxy resin having biphenyl chemical structures and bisphenol S chemical structures can be preferably used. Such phenoxy resin has a high glass-transition temperature due to rigidity resulting from the biphenyl chemical structures and has improved adhesiveness to a plating metal when manufacturing a semiconductor element mounting board 10 (multilayer printed wiring board) due to existence of the bisphenol S chemical structures.

Further, phenoxy resin having bisphenol A chemical structures and bisphenol F chemical structures can be also used. This makes it possible to improve adhesiveness of the surface layer 6 to an inner circuit layer when manufacturing a semiconductor element mounting board 10.

Furthermore, the phenoxy resin having biphenyl chemical structures and bisphenol S chemical structures and the phenoxy resin having bisphenol A chemical structures and bisphenol F chemical structures can be used in combination. This makes it possible to allow the surface layer 6 to have properties resulting from these phenoxy resins in a fine balance.

In the case where the phenoxy resin (1) having bisphenol A chemical structures and bisphenol F chemical structures and the phenoxy resin (2) having biphenyl chemical structures and bisphenol S chemical structures are used in combination, a combined ratio between (1) and (2) is not limited to a specific value, but can be set to a range of, for example, 2:8 to 9:1.

A molecular weight of the phenoxy resin is not limited to a specific value, but a weight-average molecular weight of the phenoxy resin is preferably in the range of 5,000 to 50,000, and more preferably in the range of 10,000 to 40,000.

If the weight-average molecular weight is less than the above lower limit value, there is a case that an effect of improving film-formability to the resin material is lowered. On the other hand, if the weight-average molecular weight of the phenoxy resin exceeds the above upper limit value, there is a case that solubility of the phenoxy resin is lowered.

An amount of the phenoxy resin contained in the surface layer 6 is not limited to a specific value, but is preferably in the range of 1 to 30 wt %, and more preferably in the range of 3 to 20 wt %.

If the amount of the phenoxy resin contained in the surface layer 6 is less than the above lower limit value, there is a case that an effect of improving film-formability of the surface layer 6 is lowered. On the other hand, if the amount of the phenoxy resin contained in the surface layer 6 exceeds the above upper limit value, there is a case that an effect of imparting a low-thermal expansion property to the surface layer 6 is lowered.

In the case where the amount of the cyanate resin contained in the resin material is defined as C wt % and the amount of the phenoxy resin contained in the resin material is defined as E wt %, C and E satisfy preferably a relation of $0.2 \leq E/C \leq 2$, and more preferably a relation of $0.3 \leq E/C \leq 1.5$. This makes it possible to improve the film-formability of the surface layer 6 and to more lower the coefficient of thermal expansion of the surface layer 6.

Furthermore, use of the cyanate resin (especially, novolak type cyanate resin), the phenoxy resin (especially, phenoxy resin biphenyl chemical structures or bisphenol S chemical structures) and the epoxy resin (especially, aryl alkylene type epoxy resin, and more especially, biphenyl dimethylene type epoxy resin) in combination makes it possible for the surface layer 6 to exhibit the effects of the present invention more remarkably.

In this regard, it is to be noted that the resin material constituting the surface layer 6 may contain a thermoplastic resin such as phenolic resin, polyimide resin, polyamideimide resin, polyphenylene oxide resin or polyethersulfone resin in addition to the above mentioned resins.

An amount of the above resin material contained in the surface layer 6 is preferably in the range of 30 to 70 wt %, and more preferably in the range of 40 to 60 wt %. This makes it possible to improve the heat resistance of the surface layer 6 and to lower the coefficient of thermal expansion of the surface layer 6.

Further, it is preferred that the surface layer 6 contains an inorganic filler. This makes it possible to obtain a surface layer 6 having high mechanical strength even in the case where it is formed so as to have a thin thickness (e.g., 35 μm or less). This also allows the surface layer 6 to have a low-thermal expansion property reliably.

As the inorganic filler, the same one as described in the core board 1 can be used. Among the above mentioned inorganic fillers, the silica is preferably used. From the viewpoint of excellent low-thermal expansivity, fused silica (especially, spherical fused silica) is more preferably used.

In the case where the inorganic filler is composed of particles each having a substantially spherical shape, an average particle size of the particles of the inorganic filler is not limited to a specific value, but is preferably in the range of 0.01 to 5.0 μm, and more preferably in the range of 0.2 to 2.0 μm.

An amount of the inorganic filler contained in the surface layer 6 is not limited to a specific value, but is preferably in the range of 5 to 40 wt %, and more preferably in the range of 10 to 30 wt %. By setting the amount of the inorganic filler to a value within the above range, it is possible to impart a low-coefficient of thermal expansion to the surface layer 6 effectively. As a result, the occurrence of warpage of the semiconductor element mounting board 10 can be reduced more effectively.

Further, the surface layer 6 preferably contains the same fiber member as described in the core board 1 in addition to the above components. This makes it possible to impart a low-coefficient of thermal expansion to the surface layer 6 effectively. As a result, the occurrence of warpage of the semiconductor element mounting board 10 can be reduced more effectively.

A planar shape of the semiconductor element mounting board 10 has a ratio of length and width being preferably in the range of 3:2 to 2:3, and more preferably about 1:1. In this case, the semiconductor element mounting board 10 can more remarkably exhibit the effects of the present invention.

<Method of Manufacturing Semiconductor Element Mounting Board>

Next, description will be made on an example of a method of manufacturing the semiconductor element mounting board 10 described above.

Figure 2:
FIGS. 2(a) to 2(d) are views showing an example of a method of manufacturing a semiconductor element mounting board according to the present invention.
Figure 2:
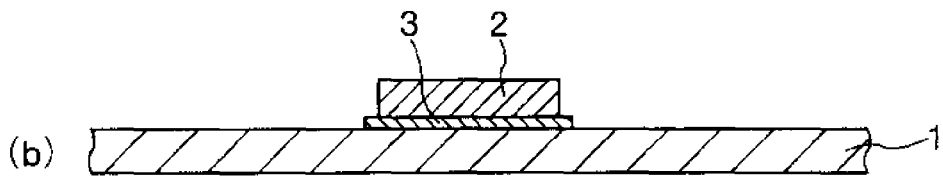
Figure 2:
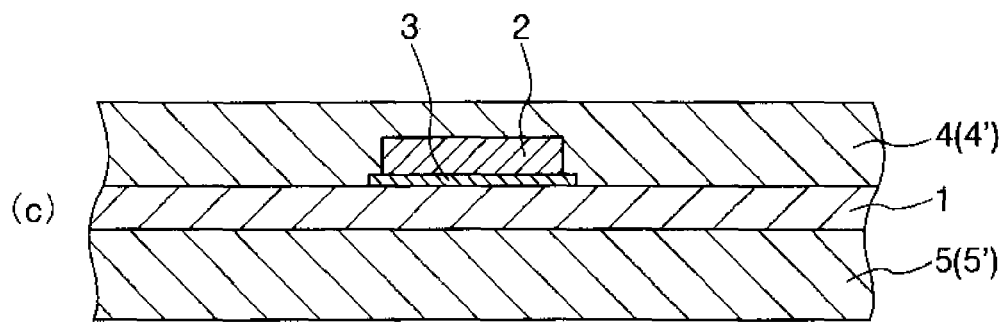
Figure 2:
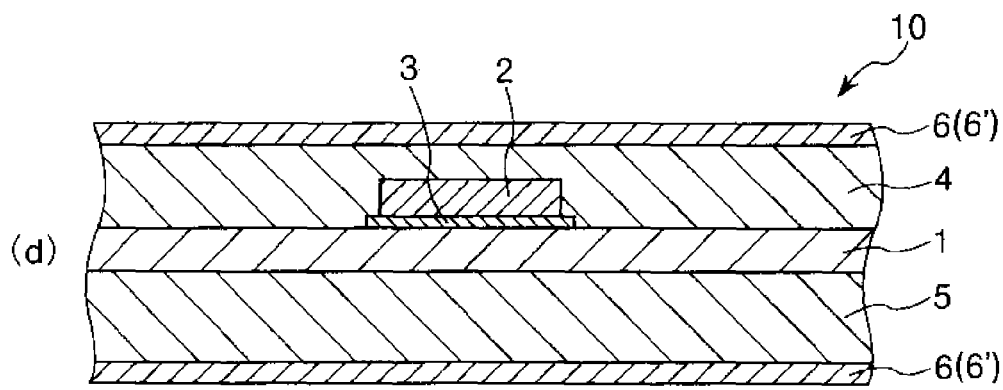

FIGS. 2(*a*) to 2(*d*) are views showing an example of the method of manufacturing the semiconductor element mounting board 10.

First, as shown in FIG. 2(*a*), the core board 1 is prepared.

Next, as shown in FIG. 2(*b*), the semiconductor element 2 is mounted on the core board 1 at a central portion thereof through the bonding film 3.

On the other hand, the material for forming each of the first layer 4 and the second layer 5 is formed in a sheet shape to prepare a dielectric sheet 4' and a dielectric sheet 5'.

Next, the dielectric sheet 4' is laminated on an upper surface of the core board 1 on which the semiconductor element 2 is mounted, and the dielectric sheet 5' is laminated on a lower surface of the core board 1 opposite to the upper surface.

Thereafter, the dielectric sheet 4' and the dielectric sheet 5' are cured to bring into the first layer 4 and the second layer 5 to thereby obtain an embedding type board in which the semiconductor element 2 is embedded into the first layer 4 (see FIG. 2(*c*)).

Further, the material for forming the surface layer 6 is formed in a sheet shape to prepare two dielectric sheets 6'.

Next, these dielectric sheets 6' are laminated on the first layer 4 and the second layer 5, respectively.

Thereafter, the dielectric sheets 6' are cured to bring into the surface layers 6 to thereby obtain a semiconductor element mounting board 10 (that is, the semiconductor element mounting board of the present invention) (see FIG. 2(*d*)).

Next, description will be made on another example of a method of manufacturing the semiconductor element mounting board 10 according to the present invention described above.

Figure 3:
FIGS. 3(a) to 3(c) are views showing another example of a method of manufacturing a semiconductor element mounting board according to the present invention.
Figure 3:
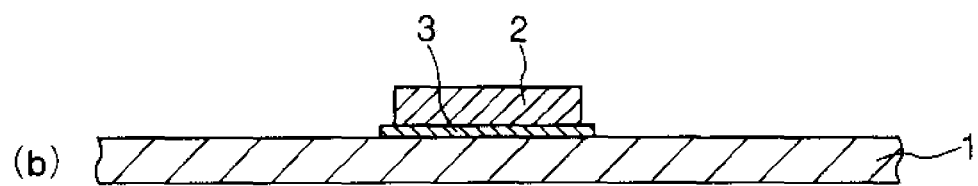
Figure 3:
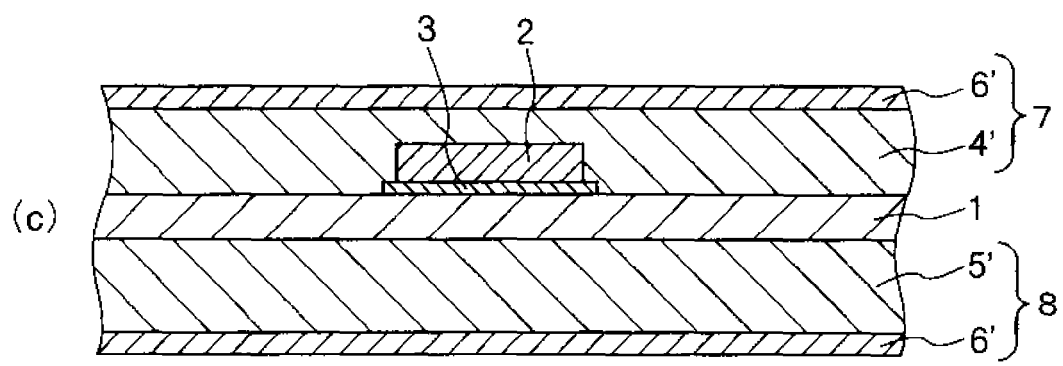

FIGS. 3(*a*) to 3(*c*) are also views showing an example of the method of manufacturing the semiconductor element mounting board 10 according to the present invention.

First, as shown in FIG. 3(*a*), the core board 1 is prepared.

Next, as shown in FIG. 3(*b*), the semiconductor element 2 is mounted on the core board 1 at a central portion thereof through the bonding film 3.

On the other hand, prepared is a dielectric sheet 7 which is composed of an integrated combination of a dielectric sheet 4' obtained by forming the above material for forming the first layer 4 in a sheet shape and a dielectric sheet 6' obtained by forming the above material for forming the surface layer 6 in a sheet shape.

Further, prepared is a dielectric sheet 8 which is composed of an integrated combination of a dielectric sheet 5' obtained by forming the above material for forming the first layer 5 in a sheet shape and a dielectric sheet 6' obtained by forming the above material for forming the surface layer 6 in a sheet shape.

In this regard, in the case where the material for forming the first layer 4 and the material for forming the surface layer 6 have the same composition, the dielectric sheet 7 can be obtained by forming a single material into a sheet shape so as to have a total thickness of the first layer 4 and the surface layer 6.

Further, in the case where the material for forming the second layer 5 and the material for forming the surface layer 6 have the same composition, the dielectric sheet 8 can be obtained by forming a single material into a sheet shape so as to have a total thickness of the second layer 5 and the surface layer 6.

In the case where the material for forming the first layer 4 and the material for forming the surface layer 6 have the same composition and the surface layer 6 includes the above fiber base member such as the glass fiber base member therein, the dielectric sheet 7 can be obtained by applying a single material on both surfaces of the fiber base member in different amounts and forming it into a sheet shape.

Further, in the case where the material for forming the second layer 5 and the material for forming the surface layer 6 have the same composition and the surface layer 6 includes the above fiber base member such as the glass fiber base member therein, the dielectric sheet 8 can be obtained by applying a single material on both surfaces of the fiber base member in different amounts and forming it into a sheet shape.

Next, as show in FIG. 3(c) the dielectric sheet 7 is laminated on an upper surface of the core board 1 on which the semiconductor element 2 is mounted, and the dielectric sheet 8 is laminated on a lower surface of the core board 1 opposite to the upper surface.

Thereafter, the dielectric sheet 7 and the dielectric sheet 8 are cured to bring into the first layer 4, the second layer 5 and the surface layers 6 to thereby obtain a semiconductor element mounting board 10 (that is, the semiconductor element mounting board of the present invention).

According to such a method, the semiconductor element mounting board 10 of the present invention can be manufactured in an easier manner. Therefore, in an actual process of manufacturing the element mounting board 10, the above mentioned method can be appropriately used.

Hereinabove, the semiconductor element mounting board of the present invention has been described, but is not limited thereto.

The method of forming the bonding agent layer using a bonding film has been described in the above mentioned embodiment, but is not limited thereto. The bonding agent layer may be formed by applying a liquid type bonding agent (adhesive agent).

The semiconductor element mounting board in which one semiconductor element 2 is provided has been described in the above mentioned embodiment, but is not limited thereto. In the semiconductor element mounting board, two or more semiconductor elements may be provided.

The semiconductor element mounting board in which each surface layer is formed from a single layer has been described in the above mentioned embodiment, but is not limited thereto. In the semiconductor element mounting board, each surface layer may be formed from a multiple layer.

The method of forming the first layer, the second layer and the surface layer, respectively, using sheets constituted from the materials for forming the layers has been described in the above mentioned embodiment, but is not limited thereto. Each layer may be formed by applying a liquid containing the material for forming each layer.

EXAMPLES

Hereinbelow, the present invention will be described in detail based on the following Examples and Comparative Examples, but is not limited to these Examples.

<1> Raw Materials Used in Examples and Comparative Examples

Raw materials used in Examples and Comparative Examples are indicated below.

(1) Cyanate resin A: Novolak type cyanate resin having a weight-average molecular weight of 700 (product name of "Primaset PT-30" produced by LONZA Japan)

(2) Cyanate resin B: Novolak type cyanate resin having a weight-average molecular weight of 2,600 (product name of "Primaset PT-60" produced by LONZA Japan)

(3) Epoxy resin: Biphenyl dimethylene type epoxy resin having an epoxy equivalent of 275 and a weight-average molecular weight of 2,000 (product name of "NC-3000" produced by Nippon Kayaku Co., Ltd.)

(4) Phenoxy resin A: Copolymer of biphenyl epoxy resin and bisphenol S epoxy resin having an epoxy group at an end thereof and a weight-average molecular weight of 30,000 (product name of "YX-8100H30" produced by Japan Epoxy Resin Co. Ltd.)

(5) Phenoxy resin B: Copolymer of bisphenol A type epoxy resin and bisphenol F type epoxy resin having an epoxy group at an end thereof and a weight-average molecular weight of 60,000 (product name of "Epicoat 4275" produced by Japan Epoxy Resin Co. Ltd.)

(6) Curing catalyst: Imidazole compound (product name of "2-phenyl-4,5-dihydroxy methyl imidazole" produced by SHIKOKU CHEMICALS CORPORATION)

(7) Inorganic filler: Spherical fused silica having an average particle size of 0.5 μm (product name of "SO-25H" produced by Admatechs Co., Ltd.)

(8) Coupling agent: Epoxy silane coupling agent (product name of "A-187" produced by Nippon Unicar Company Limited)

<2> Preparation of Resin Varnish 15 parts by weight of the cyanate resin A, 10 parts by weight of the cyanate resin B, 25 parts by weight of the epoxy resin, 5 parts by weight of the phenoxy resin A, 5 parts by weight of the phenoxy resin B and 0.4 parts by weight of the curing catalyst were dissolved and dispersed into methyl ethyl ketone.

In addition, 40 parts by weight of the inorganic filler and 0.2 parts by weight of the coupling agent were added to the methyl ethyl ketone. Thereafter, they were stirred using a high speed stirring machine for 10 minutes to thereby prepare a resin varnish containing a solid content in an amount of 50 wt %.

<3> Preparation of Dielectric Sheet (1) Preparation of Dielectric Sheet a with Base Member A plurality of dielectric sheets A with base members were prepared. Each dielectric sheet A with base member was prepared as follows.

The resin varnish obtained in the above manner was supplied on one surface of a polyethylene terephthalate (PET) film having a thickness of 38 μm using a comma coater, and then dried using a drier at 160° C. for 10 minutes to thereby obtain a dielectric sheet A with base member. In this regard, it is to be noted that the obtained dielectric sheet A had a thickness of 120 urn.

(2) Preparation of Dielectric Sheet B with Base Member

A plurality of dielectric sheets B with base members were prepared. Each dielectric sheet B with base member was prepared as follows.

The resin varnish obtained in the above manner was impregnated into a glass woven cloth having a thickness of 28 ("WEA-1035" produced by Nitto Boseki Co., Ltd.), and then dried using a furnace at 120° C. for 2 minutes. In this way, a prepreg including a varnish solid content (that is, the resins and the silica contained in the prepreg) in an amount of about 50 wt % was obtained.

This prepreg was bonded to one surface of a polyethylene terephthalate (PET) film having a thickness of 38 μm using a laminator, and then dried using a drier at 160° C. for 10 minutes to thereby obtain a dielectric sheet B with base member. In this regard, it is to be noted that the obtained dielectric sheet B had a thickness of 40 μm.

(3) Preparation of Dielectric Sheet C with Base Member

A plurality of dielectric sheets C with base members were prepared. Each dielectric sheet C with base member was prepared as follows.

The resin varnish obtained in the above manner was supplied on one surface of a polyethylene terephthalate (PET) film having a thickness of 38 μm using a comma coater, and then dried using a drier at 160° C. for 10 minutes to thereby obtain a dielectric sheet C with base member. In this regard, it is to be noted that the obtained dielectric sheet C had a thickness of 40 μm.

(4) Preparation of Dielectric Sheet D with Base Member

A plurality of dielectric sheets D with base members were prepared. Each dielectric sheet D with base member was prepared as follows.

The resin varnish obtained in the above manner was supplied on one surface of a polyethylene terephthalate (PET) film having a thickness of 38 μm using a comma coater, and then dried using a drier at 160° C. for 10 minutes to thereby obtain a dielectric sheet D with base member. In this regard, it is to be noted that the obtained dielectric sheet D had a thickness of 160 μm.

<4> Preparation of Bonding Film (1) Preparation of Bonding Film A

A bonding agent was obtained by mixing 25.0 parts by weight of an acrylate copolymer (product name of "SG-708-6" produced by Nagase Chemtex Corp.), 16.0 parts by weight of an epoxy resin (product name of "EOCN-1020-80" produced by Nippon Kayaku Co., Ltd.), 24.2 parts by weight of an epoxy resin (product name of "NC3000P" produced by Nippon Kayaku Co., Ltd.), 17.5 parts by weight of a phenol resin (product name of "PR51470" produced by Sumitomo Bakelite Co., Ltd.), 0.1 part by weight of a curing catalyst (product name of "2PHZ-PW" produced by Shikoku Chemicals Corp.), 0.4 part by weight of a bonding assistant (product name of "KBM403E" produced by Shin-Etsu Chemical Co., Ltd.), and 16.7 parts by weight of silica (product name of "SE-2050LC" produced by Admatechs) as an inorganic filler with each other. In this regard, it is to be noted that the amount of each component means an amount of its solid content.

Next, the obtained bonding agent was supplied on one surface of a release film (product name of "MRX50" produced by Mitsubishi Polyester Film Corp.) using a comma coater, and then dried using a drier at 90° C. for 5 minutes to thereby obtain a bonding film A. In this regard, it is to be noted that the obtained bonding film A had a thickness of 25 μm.

(2) Preparation of Bonding Film B

A bonding agent was obtained by mixing 11.2 parts by weight of an acrylate copolymer (product name of "SG-70L" produced by Nagase Chemtex Corp.), 6.8 parts by weight of an acryl polymer (product name of "UG-4010" produced by Toagosei Co., Ltd.), 17.7 parts by weight of an epoxy resin (product name of "EOCN-1020-80" produced by Nippon Kayaku Co., Ltd.), 26.5 parts by weight of an epoxy resin (product name of "NC6000" produced by Nippon Kayaku Co., Ltd.), 11.1 parts by weight of a phenol resin (product name of "PR-HF-3" produced by Sumitomo Bakelite Co., Ltd.), 16.6 parts by weight of a phenol resin (product name of "MEH8000H" produced by Meiwa Plastic Industries, Ltd.), 0.1 part by weight of a curing catalyst (product name of "2PHZ-PW" produced by Shikoku Chemicals Corp.), 0.1 part by weight of a bonding assistant (product name of "KBM403E" produced by Shin-Etsu Chemical Co., Ltd.), and 10.0 parts by weight of silica (product name of "SE-2050LC" produced by Admatechs) as an inorganic filler with each other. In this regard, it is to be noted that the amount of each component means an amount of its solid content.

Next, the obtained bonding agent was supplied on one surface of a release film (product name of "MRX50" produced by Mitsubishi Polyester Film Corp.) using a comma coater, and then dried using a drier at 90° C. for 5 minutes to thereby obtain a bonding film B. In this regard, it is to be noted that the obtained bonding film B had a thickness of 25 μm.

(3) Preparation of Bonding Film C

A bonding agent was obtained by mixing 53.99 parts by weight of an acrylate copolymer (product name of "SG-70L" produced by Nagase Chemtex Corp.), 3.73 parts by weight of an epoxy resin (product name of "EOCN-1020-80" produced by Nippon Kayaku Co., Ltd.), 1.91 parts by weight of a phenol resin (product name of "PR53647" produced by Sumitomo Bakelite Co., Ltd.), 0.04 part by weight of a curing catalyst (product name of "2PHZ-PW" produced by Shikoku Chemicals Corp.), 0.31 part by weight of a bonding assistant (product name of "KBM403E" produced by Shin-Etsu Chemical Co., Ltd.), and 40.01 parts by weight of silica (product name of "SE-2050LE" produced by Admatechs) as an inorganic filler with each other. In this regard, it is to be noted that the amount of each component means an amount of its solid content.

Next, the obtained bonding agent was supplied on one surface of a release film (product name of "MRX50" produced by Mitsubishi Polyester Film Corp.) using a comma coater, and then dried using a drier at 90° C. for 5 minutes to thereby obtain a bonding film C. In this regard, it is to be noted that the obtained bonding film C had a thickness of 25 μm.

(4) Preparation of Bonding Film D

A bonding agent was obtained by mixing 42.0 parts by weight of an acrylate copolymer (product name of "SG-70L" produced by Nagase Chemtex Corp.), 4.53 parts by weight of an epoxy resin (product name of "EOCN-1020-80" produced by Nippon Kayaku Co., Ltd.), 6.86 parts by weight of an epoxy resin (product name of "NC6000" produced by Nippon Kayaku Co., Ltd.), 5.92 parts by weight of a phenol resin (product name of "PR53647" produced by Sumitomo Bakelite Co., Ltd.), 0.06 part by weight of a curing catalyst (product name of "2PHZ-PW" produced by Shikoku Chemicals Corp.), 0.63 part by weight of a bonding assistant (product name of "KBM403E" produced by Shin-Etsu Chemical Co., Ltd.), and 40.0 parts by weight of silica (product name of "SE-2050LE" produced by Admatechs) as an inorganic filler with each other. In this regard, it is to be noted that the amount of each component means an amount of its solid content.

Next, the obtained bonding agent was supplied on one surface of a release film (product name of "MRX50" produced by Mitsubishi Polyester Film Corp.) using a comma coater, and then dried using a drier at 90° C. for 5 minutes to thereby obtain a bonding film D. In this regard, it is to be noted that the obtained bonding film D had a thickness of 25 μm.

<5> Manufacture of Semiconductor Element Mounting Board

Example 1

Copper foils of a double-sided copper-clad laminated board ("ELC-4785GS" produced by Sumitomo Bakelite Co., Ltd.) were processed (removed) by subjecting them to an etching treatment to thereby obtain a core board having a thickness of 100 μm and a size of 40 mm square.

Next, a semiconductor element (chip) having a thickness of 75 μm and a size of 10 mm square was bonded to the core board at a central portion thereof using the bonding film A from which the release film had been removed by heating and pressing them at a temperature of 130° C.

Next, the dielectric sheets A with base members were laminated on the core board so that the dielectric sheets A made contact with both a surface of the core board on which the semiconductor element was mounted and a surface thereof on which the semiconductor element was not mounted. Thereafter, the dielectric sheets A were shaped using a vacuum press type laminator at a pressure of 0.8 MPa, at a temperature of 100° C. for a time of 30 seconds.

Next, the dielectric sheets A were heated and cured using a hot-air dryer at a temperature of 170° C. for a time of 45 minutes, and then the base members were, respectively, peeled off and removed from the dielectric sheets A. In this way, an embedding board into which the semiconductor element was embedded was obtained. Namely, a first layer and a second layer were formed on the core board, respectively.

Next, the dielectric sheets B with base members obtained in the above manner were laminated on the first layer and the second layer so that the dielectric sheets B made contact with both the layers, respectively. Thereafter, the dielectric sheets B were shaped using a vacuum press type laminator at a pressure of 0.8 MPa, at a temperature of 80° C. for a time of 30 seconds.

Next, the dielectric sheets B were heated and cured using a hot-air dryer at a temperature of 180° C. for a time of 45 minutes, the base members were, respectively, peeled off and removed from the dielectric sheets B, and then the dielectric sheets B were heated and cured using the hot-air dryer at a temperature of 200° C. for a time of 60 minutes. In this way, a semiconductor element mounting board for evaluation was obtained.

Example 2

A semiconductor element mounting board for evaluation was obtained in the same manner as in Example 1 except that the bonding film B was used instead of the bonding film A.

Example 3

A semiconductor element mounting board for evaluation was obtained in the same manner as in Example 1 except that the bonding film C was used instead of the bonding film A.

Example 4

First, a semiconductor element was mounted on a core board in the same manner as in Example 1. Next, commercial dielectric sheets E each having an average thickness of 120 μm with base members (product name of "ABF-GX13" produced by Ajinomoto Fine Chemical Co., Ltd.) were laminated on the core board so that the dielectric sheets E made contact with both a surface of the core board on which the semiconductor element was mounted and a surface thereof on which the semiconductor element was not mounted. Thereafter, the dielectric sheets E were shaped using a vacuum press type laminator at a pressure of 1.0 MPa, at a temperature of 105° C. for a time of 30 seconds.

Next, the base members were, respectively, peeled off and removed from the dielectric sheets E, and then the dielectric sheets E were heated and cured using a hot-air dryer at a temperature of 180° C. for a time of 90 minutes. In this way, an embedding board into which the semiconductor element was embedded was obtained. Namely, a first layer and a second layer were formed on the core board, respectively.

Next, the dielectric sheets B with base members were laminated on the first layer and the second layer so that the dielectric sheets B made contact with both the layers, respectively. Thereafter, the dielectric sheets B were shaped using a vacuum press type laminator at a pressure of 0.8 MPa, at a temperature of 80° C. for a time of 30 seconds.

Next, the dielectric sheets B were heated and cured using a hot-air dryer at a temperature of 180° C. for a time of 45 minutes, the base members were, respectively, peeled off and removed from the dielectric sheets B, and then the dielectric sheets B were heated and cured at a temperature of 200° C. for a time of 60 minutes. In this way, a semiconductor element mounting board for evaluation was obtained.

Example 5

A semiconductor element mounting board for evaluation was obtained in the same manner as in Example 4 except that the bonding film B was used instead of the bonding film A.

Example 6

A semiconductor element mounting board for evaluation was obtained in the same manner as in Example 4 except that the bonding film C was used instead of the bonding film A.

Example 7

First, a semiconductor element was mounted on a core board in the same manner as in Example 1. Next, the dielectric sheets A with base members were laminated on the core board so that the dielectric sheets A made contact with both a surface of the core board on which the semiconductor element was mounted and a surface thereof on which the semiconductor element was not mounted. Thereafter, the dielectric sheets A were shaped using a vacuum press type laminator at a pressure of 1.0 MPa, at a temperature of 105° C. for a time of 30 seconds.

Next, the base members were, respectively, peeled off and removed from the dielectric sheets A, and then the dielectric sheets A were heated and cured using a hot-air dryer at a temperature of 180° C. for a time of 90 minutes. In this way, an embedding board into which the semiconductor element was embedded was obtained. Namely, a first layer and a second layer were formed on the core board, respectively.

Next, the dielectric sheets C with base members were laminated on the first layer and the second layer so that the dielectric sheets C made contact with both the layers, respectively. Thereafter, the dielectric sheets C were shaped using a vacuum press type laminator at a pressure of 0.8 MPa, at a temperature of 80° C. for a time of 30 seconds.

Next, the dielectric sheets C were heated and cured using a hot-air dryer at a temperature of 180° C. for a time of 45 minutes, the base members were, respectively, peeled off and removed from the dielectric sheets C, and then the dielectric sheets C were heated and cured using the hot-air dryer at a temperature of 200° C. for a time of 60 minutes. In this way, a semiconductor element mounting board for evaluation was obtained.

Example 8

A semiconductor element mounting board for evaluation was obtained in the same manner as in Example 7 except that the bonding film B was used instead of the bonding film A.

Example 9

A semiconductor element mounting board for evaluation was obtained in the same manner as in Example 7 except that the bonding film C was used instead of the bonding film A.

Example 10

Copper foils of a double-sided copper-clad laminated board ("ELC-4785GS" produced by Sumitomo Bakelite Co., Ltd.) were processed (removed) by subjecting them to an etching treatment to thereby obtain a core board having a thickness of 100 μm and a size of 40 mm square.

Next, a semiconductor element (chip) having a thickness of 140 μm and a size of 10 mm square was bonded to the core board at a central portion thereof using the bonding film A from which the release film had been removed by heating and pressing them at a temperature of 130° C.

Next, the dielectric sheets D with base members were laminated on the core board so that the dielectric sheets D made contact with both a surface of the core board on which the semiconductor element was mounted and a surface thereof on which the semiconductor element was not mounted. Thereafter, the dielectric sheets D were shaped using a vacuum press type laminator at a pressure of 0.8 MPa, at a temperature of 100° C. for a time of 30 seconds.

Next, the dielectric sheets D were heated and cured using a hot-air dryer at a temperature of 170° C. for a time of 45 minutes, and then the base members were, respectively, peeled off and removed from the dielectric sheets D. In this way, an embedding board into which the semiconductor element was embedded was obtained. Namely, a first layer and a second layer were formed on the core board, respectively.

Next, the dielectric sheets B with base members were laminated on the first layer and the second layer so that the dielectric sheets B made contact with both the layers, respectively. Thereafter, the dielectric sheets B were shaped using a vacuum press type laminator at a pressure of 0.8 MPa, at a temperature of 80° C. for a time of 30 seconds.

Next, the dielectric sheets B were heated and cured using a hot-air dryer at a temperature of 180° C. for a time of 45 minutes, the base members were, respectively, peeled off and removed from the dielectric sheets B, and then the dielectric sheets B were heated and cured using the hot-air dryer at a temperature of 200° C. for a time of 60 minutes. In this way, a semiconductor element mounting board for evaluation was obtained.

Example 11

A semiconductor element mounting board for evaluation was obtained in the same manner as in Example 10 except that the bonding film B was used instead of the bonding film A.

Example 12

A semiconductor element mounting board for evaluation was obtained in the same manner as in Example 10 except that the bonding film C was used instead of the bonding film A.

Example 13

First, a semiconductor element was mounted on a core board in the same manner as in Example 10. Next, commercial dielectric sheets F each having an average thickness of 160 μm with base members (product name of "ABF-GX13" produced by Ajinomoto Fine Chemical Co., Ltd.) were laminated on the core board so that the dielectric sheets F made contact with both a surface of the core board on which the semiconductor element was mounted and a surface thereof on which the semiconductor element was not mounted. Thereafter, the dielectric sheets F were shaped using a vacuum press type laminator at a pressure of 1.0 MPa, at a temperature of 105° C. for a time of 30 seconds.

Next, the base members were, respectively, peeled off and removed from the dielectric sheets F, and then the dielectric sheets F were heated and cured using a hot-air dryer at a temperature of 180° C. for a time of 90 minutes. In this way, an embedding board into which the semiconductor element was embedded was obtained. Namely, a first layer and a second layer were formed on the core board, respectively.

Next, the dielectric sheets B with base members were laminated on the first layer and the second layer so that the dielectric sheets B made contact with both the layers, respectively. Thereafter, the dielectric sheets B were shaped using a vacuum press type laminator at a pressure of 0.8 MPa, at a temperature of 80° C. for a time of 30 seconds.

Next, the dielectric sheets B were heated and cured using a hot-air dryer at a temperature of 180° C. for a time of 45 minutes, the base members were, respectively, peeled off and removed from the dielectric sheets B, and then the dielectric sheets B were heated and cured using the hot-air dryer at a temperature of 200° C. for a time of 60 minutes. In this way, a semiconductor element mounting board for evaluation was obtained.

Example 14

A semiconductor element mounting board for evaluation was obtained in the same manner as in Example 13 except that the bonding film B was used instead of the bonding film A.

Example 15

A semiconductor element mounting board for evaluation was obtained in the same manner as in Example 13 except that the bonding film C was used instead of the bonding film A.

Example 16

First, a semiconductor element was mounted on a core board in the same manner as in Example 10. Next, the dielectric sheets D with base members were laminated on the core board so that the dielectric sheets D made contact with both a surface of the core board on which the semiconductor element was mounted and a surface thereof on which the semiconductor element was not mounted. Thereafter, the dielectric sheets D were shaped using a vacuum press type laminator at a pressure of 1.0 MPa, at a temperature of 105° C. for a time of 30 seconds.

Next, the base members were, respectively, peeled off and removed from the dielectric sheets D, and then the dielectric sheets D were heated and cured using a hot-air dryer at a temperature of 180° C. for a time of 90 minutes. In this way, an embedding board into which the semiconductor element was embedded was obtained. Namely, a first layer and a second layer were formed on the core board, respectively.

Next, the dielectric sheets C with base members were laminated on the first layer and the second layer so that the dielectric sheets C made contact with both the layers, respectively. Thereafter, the dielectric sheets C were shaped using a vacuum press type laminator at a pressure of 0.8 MPa, at a temperature of 80° C. for a time of 30 seconds.

Next, the dielectric sheets C were heated and cured using a hot-air dryer at a temperature of 180° C. for a time of 45 minutes, the base members were, respectively, peeled off and removed from the dielectric sheets C, and then the dielectric sheets C were heated and cured using the hot-air dryer at a temperature of 200° C. for a time of 60 minutes. In this way, a semiconductor element mounting board for evaluation was obtained.

Example 17

A semiconductor element mounting board for evaluation was obtained in the same manner as in Example 16 except that the bonding film C was used instead of the bonding film A.

Comparative Example 1

A semiconductor element mounting board for evaluation was obtained in the same manner as in Example 1 except that the bonding film D was used instead of the bonding film A.

Comparative Example 2

A semiconductor element mounting board for evaluation was obtained in the same manner as in Example 4 except that the bonding film D was used instead of the bonding film A.

Comparative Example 3

A semiconductor element mounting board for evaluation was obtained in the same manner as in Example 7 except that the bonding film D was used instead of the bonding film A.

Comparative Example 4

A semiconductor element mounting board for evaluation was obtained in the same manner as in Example 10 except that the bonding film D was used instead of the bonding film A.

Comparative Example 5

A semiconductor element mounting board for evaluation was obtained in the same manner as in Example 13 except that the bonding film D was used instead of the bonding film A.

Comparative Example 6

A semiconductor element mounting board for evaluation was obtained in the same manner as in Example 16 except that the bonding film D was used instead of the bonding film A.

Comparative Example 7

First, a semiconductor element was mounted on a core board in the same manner as in Example 1. Next, commercial dielectric sheets E each having an average thickness of 120 µm with base members (product name of "ABF-GX13" produced by Ajinomoto Fine Chemical Co., Ltd.) were laminated on the core board so that the dielectric sheets E made contact with both a surface of the core board on which the semiconductor element was mounted and a surface thereof on which the semiconductor element was not mounted. Thereafter, the dielectric sheets E were shaped using a vacuum press type laminator at a pressure of 1.0 MPa, at a temperature of 105° C. for a time of 30 seconds.

Next, the base members were, respectively, peeled off and removed from the dielectric sheets E, and then the dielectric sheets E were heated and cured using a hot-air dryer at a temperature of 180° C. for a time of 90 minutes. In this way, an embedding board into which the semiconductor element was embedded was obtained. Namely, a first layer and a second layer were formed on the core board, respectively.

Next, commercial dielectric sheets G each having an average thickness of 40 µm with base members (product name of "ABF-GX13" produced by Ajinomoto Fine Chemical Co., Ltd.) were laminated on the first layer and the second layer so that the dielectric sheets G made contact with both the layers, respectively. Thereafter, the dielectric sheets G were shaped using a vacuum press type laminator at a pressure of 0.8 MPa, at a temperature of 80° C. for a time of 30 seconds.

Next, the dielectric sheets G were heated and cured using a hot-air dryer at a temperature of 180° C. for a time of 45 minutes, the base members were, respectively, peeled off and removed from the dielectric sheets G, and then the dielectric sheets G were heated and cured using the hot-air dryer at a temperature of 200° C. for a time of 60 minutes. In this way, a semiconductor element mounting board for evaluation was obtained.

Comparative Example 8

First, a semiconductor element was mounted on a core board in the same manner as in Example 11. Next, commercial dielectric sheets F each having an average thickness of 160 µm with base members (product name of "ABF-GX13" produced by Ajinomoto Fine Chemical Co., Ltd.) were laminated on the core board so that the dielectric sheets F made contact with both a surface of the core board on which the semiconductor element was mounted and a surface thereof on which the semiconductor element was not mounted. Thereafter, the dielectric sheets F were shaped using a vacuum press type laminator at a pressure of 1.0 MPa, at a temperature of 105° C. for a time of 30 seconds.

Next, the base members were, respectively, peeled off and removed from the dielectric sheets F, and then the dielectric sheets F were heated and cured using a hot-air dryer at a temperature of 180° C. for a time of 90 minutes. In this way, an embedding board into which the semiconductor element was embedded was obtained. Namely, a first layer and a second layer were formed on the core board, respectively.

Next, commercial dielectric sheets G each having an average thickness of 40 µm with base members (product name of "ABF-GX13" produced by Ajinomoto Fine Chemical Co., Ltd.) were laminated on the first layer and the second layer so that the dielectric sheets G made contact with both the layers, respectively. Thereafter, the dielectric sheets G were shaped using a vacuum press type laminator at a pressure of 0.8 MPa, at a temperature of 80° C. for a time of 30 seconds.

Next, the dielectric sheets G were heated and cured using a hot-air dryer at a temperature of 180° C. for a time of 45 minutes, the base members were, respectively, peeled off and removed from the dielectric sheets G, and then the dielectric sheets G were heated and cured using the hot-air dryer at a temperature of 200° C. for a time of 60 minutes. In this way, a semiconductor element mounting board for evaluation was obtained.

A Young's modulus, a coefficient of linear expansion (coefficient of thermal expansion) and a glass-transition temperature of each of the surface layer and the first layer (second layer) of the semiconductor element mounting board obtained in each of Examples and Comparative Examples were measured as follows. These results are shown in Tables 1 and 2.

Further, a storage modulus of the bonding film used in each of Examples and Comparative Examples was also measured as follows. These results are also shown in Table 1.

Furthermore, a Young's modulus, a coefficient of linear expansion (coefficient of thermal expansion) and a glass-transition temperature of each of the bonding film and the core board of the semiconductor element mounting board obtained in each of Examples and Comparative Examples were also measured as follows. These results are also shown in Tables 1 and 2.

In addition, an area of the semiconductor element in a planar view thereof is shown in Table 2 as "S" when defining an area of the first layer in a planar view thereof as "100". Further, a volume of the semiconductor element is shown in Table 2 as "T" when defining a volume of the first layer as "100". Furthermore, a ratio between a thickness of the core board and a thickness of the first layer is shown in Table 2.

Young's Modulus

Two dielectric sheets with the base members used for forming each of the surface layer and the first layer (second layer) of the semiconductor element mounting board obtained in each of Examples and Comparative Examples were laminated on each other so that the dielectric sheets made contact with each other. Thereafter, the dielectric sheets were shaped using a vacuum presser at a pressure of 2 MPa, at a temperature of 200° C. for a time of 2 hours.

Next, the base members were, respectively, peeled off and removed from the dielectric sheets to thereby obtain a dielectric sheet cured product. An evaluation sample having a size of 8 mm×35 mm was collected from the dielectric sheet cured product, and then a Young's modulus of the evaluation sample at 25° C. was measured using a DMA machine ("DMA 2980" produced by TA Instrument) under predetermined conditions (measurement mode: tension mode, measurement length: 20 mm, temperature rising rate: 5° C./min., measurement temperature range: 0 to 350° C., frequency: 1 Hz).

Coefficient of Linear Expansion (Coefficient of Thermal Expansion)

Two dielectric sheets with the base members used for forming each of the surface layer and the first layer (second layer) of the semiconductor element mounting board obtained in each of Examples and Comparative Examples were laminated on each other so that the dielectric sheets made contact with each other. Thereafter, the dielectric sheets were shaped using a vacuum presser at a pressure of 2 MPa, at a temperature of 200° C. for a time of 2 hours.

Next, the base members were, respectively, peeled off and removed from the dielectric sheets to thereby obtain a dielectric sheet cured product. An evaluation sample having a size of 4 mm×20 mm was collected from the dielectric sheet cured product, and then a coefficient of thermal expansion of the evaluation sample in an inplane direction thereof was measured using a TMA machine ("TMA 2940" produced by TA Instrument) under predetermined conditions (measurement mode: tension mode, measurement length: 20 mm, temperature rising rate: 10° C./min, measurement temperature range: 0 to 300° C., measurement load: 5 gf).

Glass-Transition Temperature

Two dielectric sheets with the base members used for forming each of the surface layer and the first layer (second layer) of the semiconductor element mounting board obtained in each of Examples and Comparative Examples were laminated on each other so that the dielectric sheets made contact with each other. Thereafter, the dielectric sheets were shaped using a vacuum presser at a pressure of 2 MPa, at a temperature of 200° C. for a time of 2 hours.

Next, the base members were, respectively, peeled off and removed from the dielectric sheets to thereby obtain a dielectric sheet cured product. An evaluation sample having a size of 10 mm×30 mm was collected (cut off) from the dielectric sheet cured product, and then heated using a DMA machine ("DMA 2980" produced by TA Instrument) under predetermined conditions (measurement mode: tension mode, measurement length: 20 mm, temperature rising rate: 5° C./min, measurement temperature range: 0 to 350° C., frequency: 1 Hz). A glass-transition temperature of the evaluation sample was defined as a peak value of tan δ.

Evaluation of Bonding Film (Method of Measuring Storage Modulus)

The bonding film having the thickness of 25 μm, which was obtained in each of Examples and Comparative Examples, was subjected to a heat treatment at 175° C. for 2 hours to obtain a cured product of the bonding film.

Next, an evaluation sample having a size of 10 mm×25 mm was collected (cut off) from the cured product of the bonding film, and then heated using a DMA machine ("DMS 210" produced by SEIKO Instrument) under predetermined conditions (measurement mode: tension mode, measurement length: 20 mm, temperature rising rate: 3° C./min, measurement temperature range: −65 to 300° C., frequency: 10 Hz). In this way, a storage modulus (E') of the evaluation sample was measured.

(Method of Measuring Glass-Transition Temperature and Coefficient of Thermal Expansion in Inplane Direction)

The bonding film having the thickness of 25 μm, which was obtained in each of Examples and Comparative Examples, was subjected to a heat treatment at 175° C. for 2 hours to obtain a cured product of the bonding film.

Next, an evaluation sample having a size of 3 mm×25 mm was collected (cut off) from the cured product of the bonding film, and then heated using a TMA machine ("TMA/SS6100" produced by SEIKO Instrument) under predetermined conditions (measurement mode: tension mode, measurement length: 10 mm, temperature rising rate: 5° C./min, measurement temperature range: −65 to 300° C., measuring load: 1 gf). In this way, a coefficient of thermal expansion of the evaluation sample in an inplane direction thereof was measured. Further, a glass-transition temperature of the evaluation sample was calculated using an inflection point measured in tensing the evaluation sample.

TABLE 1

| | Surface layer | | | | Bonding film | | | |
|---|---|---|---|---|---|---|---|---|
| | Average thickness [μm] | Young's Modulus [Gpa] | Coefficient of thermal expansion in inplane direction [ppm/° C.] | Glass-transition temperature [° C.] | Average thickness [μm] | Coefficient of thermal expansion in inplane direction [ppm/° C.] | Glass-transition temperature [° C.] | Storage modulus [MPa] |
| Ex. 1 | 40 | 12 | 16 | 250 | 25 | 292 | 21 | 8 |
| Ex. 2 | 40 | 12 | 16 | 250 | 25 | 117 | 148 | 700 |
| Ex. 3 | 40 | 12 | 16 | 250 | 25 | 159 | 24 | 100 |
| Ex. 4 | 40 | 12 | 16 | 250 | 25 | 292 | 21 | 8 |
| Ex. 5 | 40 | 12 | 16 | 250 | 25 | 117 | 148 | 700 |
| Ex. 6 | 40 | 12 | 16 | 250 | 25 | 159 | 24 | 100 |
| Ex. 7 | 40 | 5 | 30 | 240 | 25 | 292 | 21 | 8 |
| Ex. 8 | 40 | 5 | 30 | 240 | 25 | 117 | 148 | 700 |
| Ex. 9 | 40 | 5 | 30 | 240 | 25 | 159 | 24 | 100 |
| Ex. 10 | 40 | 12 | 16 | 250 | 25 | 292 | 21 | 8 |
| Ex. 11 | 40 | 12 | 16 | 250 | 25 | 117 | 148 | 700 |
| Ex. 12 | 40 | 12 | 16 | 250 | 25 | 159 | 24 | 100 |
| Ex. 13 | 40 | 12 | 16 | 250 | 25 | 292 | 21 | 8 |
| Ex. 14 | 40 | 12 | 16 | 250 | 25 | 117 | 148 | 700 |
| Ex. 15 | 40 | 12 | 16 | 250 | 25 | 159 | 24 | 100 |
| Ex. 16 | 40 | 5 | 30 | 240 | 25 | 292 | 21 | 8 |
| Ex. 17 | 40 | 5 | 30 | 240 | 25 | 159 | 24 | 700 |
| Comp. Ex. 1 | 40 | 12 | 16 | 250 | 25 | 59 | 168 | 2300 |
| Comp. Ex. 2 | 40 | 12 | 16 | 250 | 25 | 59 | 168 | 2300 |
| Comp. Ex. 3 | 40 | 5 | 30 | 240 | 25 | 59 | 168 | 2300 |
| Comp. Ex. 4 | 40 | 12 | 16 | 250 | 25 | 59 | 168 | 2300 |
| Comp. Ex. 5 | 40 | 12 | 16 | 250 | 25 | 59 | 168 | 2300 |
| Comp. Ex. 6 | 40 | 5 | 30 | 240 | 25 | 59 | 168 | 2300 |
| Comp. Ex. 7 | 40 | 4 | 46 | 190 | 25 | 292 | 21 | 8 |
| Comp. Ex. 8 | 40 | 4 | 46 | 190 | 25 | 159 | 24 | 700 |

TABLE 2

| | First layer (Second layer) | | | | Core Board | | | | | | |
|---|---|---|---|---|---|---|---|---|---|---|---|
| | Average thickness $T_2$ [μm] | Young's Modulus [GPa] | Coefficient of thermal expansion in inplane direction [ppm/° C.] | Glass-transition temperature [° C.] | Average thickness $T_1$ [μm] | Young's Modulus [GPa] | Coefficient of thermal expansion in inplane direction [ppm/° C.] | Glass-transition temperature [° C.] | $T_1/T_2$ | S | V |
| Ex. 1 | 120 | 5 | 30 | 240 | 100 | 29 | 11 | 265 | 1.2 | 6.25 | 1.1 |
| Ex. 2 | 120 | 5 | 30 | 240 | 100 | 29 | 11 | 265 | 1.2 | 6.25 | 1.1 |
| Ex. 3 | 120 | 5 | 30 | 240 | 100 | 29 | 11 | 265 | 1.2 | 6.25 | 1.1 |
| Ex. 4 | 120 | 4 | 46 | 190 | 100 | 29 | 11 | 265 | 1.2 | 6.25 | 1.1 |
| Ex. 5 | 120 | 4 | 46 | 190 | 100 | 29 | 11 | 265 | 1.2 | 6.25 | 1.1 |
| Ex. 6 | 120 | 4 | 46 | 190 | 100 | 29 | 11 | 265 | 1.2 | 6.25 | 1.1 |
| Ex. 7 | 120 | 5 | 30 | 240 | 100 | 29 | 11 | 265 | 1.2 | 6.25 | 1.1 |
| Ex. 8 | 120 | 5 | 30 | 240 | 100 | 29 | 11 | 265 | 1.2 | 6.25 | 1.1 |
| Ex. 9 | 120 | 5 | 30 | 240 | 100 | 29 | 11 | 265 | 1.2 | 6.25 | 1.1 |
| Ex. 10 | 160 | 5 | 30 | 240 | 100 | 29 | 11 | 265 | 1.6 | 6.25 | 1.75 |
| Ex. 11 | 160 | 5 | 30 | 240 | 100 | 29 | 11 | 265 | 1.6 | 6.25 | 1.75 |
| Ex. 12 | 160 | 5 | 30 | 240 | 100 | 29 | 11 | 265 | 1.6 | 6.25 | 1.75 |
| Ex. 13 | 160 | 4 | 46 | 190 | 100 | 29 | 11 | 265 | 1.6 | 6.25 | 1.75 |
| Ex. 14 | 160 | 4 | 46 | 190 | 100 | 29 | 11 | 265 | 1.6 | 6.25 | 1.75 |
| Ex. 15 | 160 | 4 | 46 | 190 | 100 | 29 | 11 | 265 | 1.6 | 6.25 | 1.75 |
| Ex. 16 | 160 | 5 | 30 | 240 | 100 | 29 | 11 | 265 | 1.6 | 6.25 | 1.75 |
| Ex. 17 | 160 | 5 | 30 | 240 | 100 | 29 | 11 | 265 | 1.6 | 6.25 | 1.75 |
| Comp. Ex. 1 | 120 | 5 | 30 | 240 | 100 | 29 | 11 | 265 | 1.2 | 6.25 | 1.1 |
| Comp. Ex. 2 | 120 | 4 | 46 | 190 | 100 | 29 | 11 | 265 | 1.2 | 6.25 | 1.1 |
| Comp. Ex. 3 | 120 | 5 | 30 | 240 | 100 | 29 | 11 | 265 | 1.2 | 6.25 | 1.1 |
| Comp. Ex. 4 | 160 | 5 | 30 | 240 | 100 | 29 | 11 | 265 | 1.6 | 6.25 | 1.75 |

TABLE 2-continued

| | First layer (Second layer) | | | | Core Board | | | | | | |
|---|---|---|---|---|---|---|---|---|---|---|---|
| | Average thickness $T_2$ [μm] | Young's Modulus [GPa] | Coefficient of thermal expansion in inplane direction [ppm/° C.] | Glass-transition temperature [° C.] | Average thickness $T_1$ [μm] | Young's Modulus [GPa] | Coefficient of thermal expansion in inplane direction [ppm/° C.] | Glass-transition temperature [° C.] | $T_1/T_2$ | S | V |
| Comp. Ex. 6 | 160 | 4 | 46 | 190 | 100 | 29 | 11 | 265 | 1.6 | 6.25 | 1.75 |
| Comp. Ex. 6 | 160 | 5 | 30 | 240 | 100 | 29 | 11 | 265 | 1.6 | 6.25 | 1.75 |
| Comp. Ex. 7 | 120 | 4 | 46 | 190 | 100 | 29 | 11 | 265 | 1.2 | 6.25 | 1.1 |
| Comp. Ex. 8 | 160 | 4 | 46 | 190 | 100 | 29 | 11 | 265 | 1.6 | 6.25 | 1.75 |

<6> Evaluation of Semiconductor Element Mounting Board

[1] Warpage of the semiconductor element mounting board obtained in each of Examples and Comparative Examples was measured at normal temperature (25° C.). These results are shown in Table 3.

Further, warpage of the semiconductor element mounting board obtained in each of Examples and Comparative Examples was measured at 260° C. These results are shown in Table 3.

Furthermore, in the semiconductor element mounting board obtained in each of Examples and Comparative Examples, an absolute value of a difference between warpage at normal temperature and warpage at 260° C. was calculated. These results are also shown in Table 3.

[2] 10 semiconductor element mounting boards obtained in each of Examples and Comparative Examples were subjected to a thermal cycle test. By using this thermal cycle test, it was confirmed whether or not the semiconductor element was protected. Specifically, in the thermal cycle test, each semiconductor element mounting board was treated by repeating 3,000 thermal cycles each consisting of cooling at −65° C. and heating at 150° C. Thereafter, a comparative evaluation of the results confirmed in the semiconductor element mounting boards of Examples and Comparative Examples was carried out.

After treatment of the thermal cycle test, the semiconductor element mounting boards were cut off, and then sections thereof were checked. As a result, a semiconductor element mounting board in which cracks in the mounted semiconductor element, delamination of an interface between the mounted semiconductor element and the first layer and delamination of an interface between the mounted semiconductor element and the core board did not occur was defined as a good-quality article, and the number of the good-quality article was counted. These results are shown in Table 3.

TABLE 3

| | Number of good-quality article after treatment of thermal cycle test | | Evaluation of warpage | | |
|---|---|---|---|---|---|
| | After treatment of 1000 cycles | After treatment of 3000 cycles | Warpage at normal temperature (25° C.) [μm] | Warpage at 260° C. [μm] | Absolute value of difference between warpage at normal temperature (25° C.) and warpage at 260° C. [μm] |
| Ex. 1 | 10 | 10 | 54 | 39 | 15 |
| Ex. 2 | 10 | 10 | −55 | 85 | 140 |
| Ex. 3 | 10 | 10 | 10 | 55 | 45 |
| Ex. 4 | 10 | 10 | 45 | 54 | 9 |
| Ex. 5 | 10 | 10 | −67 | 51 | 118 |
| Ex. 6 | 10 | 10 | 5 | 52 | 47 |
| Ex. 7 | 10 | 8 | −49 | 42 | 91 |
| Ex. 8 | 10 | 7 | −80 | 77 | 157 |
| Ex. 9 | 10 | 7 | −55 | 53 | 108 |
| Ex. 10 | 10 | 10 | −52 | 65 | 117 |
| Ex. 11 | 10 | 10 | −77 | 58 | 135 |
| Ex. 12 | 10 | 10 | −61 | 60 | 121 |
| Ex. 13 | 10 | 10 | −37 | 58 | 95 |
| Ex. 14 | 10 | 10 | −78 | 46 | 124 |
| Ex. 15 | 10 | 10 | −53 | 55 | 108 |
| Ex. 16 | 10 | 8 | −57 | 43 | 100 |
| Ex. 17 | 10 | 8 | −75 | 47 | 122 |
| Comp. Ex. 1 | 5 | 0 | −90 | 83 | 173 |
| Comp. Ex. 2 | 4 | 0 | −98 | 50 | 148 |
| Comp. Ex. 3 | 4 | 0 | −139 | 68 | 207 |
| Comp. Ex. 4 | 5 | 0 | −97 | 59 | 156 |

TABLE 3-continued

| | Number of good-quality article after treatment | | Evaluation of warpage | | |
|---|---|---|---|---|---|
| | of thermal cycle test | | Warpage at | | Absolute value of difference |
| | After treatment of 1000 cycles | After treatment of 3000 cycles | normal temperature (25° C.) [μm] | Warpage at 260° C. [μm] | between warpage at normal temperature (25° C.) and warpage at 260° C. [μm] |
| Comp. Ex. 5 | 4 | 0 | −98 | 63 | 161 |
| Comp. Ex. 6 | 4 | 0 | −128 | 50 | 178 |
| Comp. Ex. 7 | 9 | 6 | −92 | 56 | 148 |
| Comp. Ex. 8 | 8 | 4 | −116 | 64 | 180 |

As shown in Table 3, in each of the semiconductor mounting boards of the present invention obtained in Examples, occurrence of warpage thereof and undesired delamination of the semiconductor element from the core board were prevented. As a result, each of the semiconductor mounting boards of the present invention obtained in Examples had high reliability.

Further, in each of the semiconductor mounting boards of the present invention obtained in Examples, occurrence of cracks in the semiconductor element and delamination of the semiconductor element from the core board due to change of an external environment were prevented, and occurrence of warpage thereof was also reduced.

In contrast, in each of the semiconductor mounting boards obtained in Comparative Examples, sufficient results could not be obtained.

INDUSTRIAL APPLICABILITY

According to the present invention, it is possible to provide a semiconductor element mounting board which can reduce occurrence of warpage thereof and prevent delamination of a semiconductor element embedded therein from a core board. Thus, the present invention has industrial applicability.

What is claimed is:

1. A semiconductor element mounting board, comprising:
a board having surfaces;
a semiconductor element provided at a side of one of the surfaces of the board;
a bonding agent layer through which the board and the semiconductor element are bonded together, the bonding agent layer having a storage modulus at 25° C. of 5 to 1,000 MPa;
a first layer into which the semiconductor element is embedded, the first layer provided on the one surface of the board;
a second layer provided on the other surface of the board; and
surface layers provided on the first and second layers, respectively, each of the surface layers being formed from at least a single layer,
wherein a coefficient of thermal expansion of each surface layer in an inplane direction thereof measured based on JIS C 6481 at a temperature of 20° C. to a glass-transition temperature $Tg_a$ ° C., which is measured based on JIS C 6481, is 40 ppm/° C. or lower, and
wherein the bonding agent layer is formed of a bonding agent, and the bonding agent comprises a resin composition containing (meth)acrylate copolymer, epoxy resin, phenol resin and an inorganic filler,
wherein an amount by weight of the (meth)acrylate copolymer contained in the resin composition is lower than a total amount by weight of the epoxy resin and the phenol resin contained in the resin composition, and
wherein the (meth)acrylate copolymer is an acrylic acid copolymer obtained by polymerizing monomers each having an epoxy group, a hydroxyl group, a carboxyl group or a nitrile group.

2. The semiconductor element mounting board as claimed in claim 1, wherein in the case where an average thickness of the board is defined as $T_1$ μm and an average thickness of the first layer is defined as $T_2$ μm, $T_1$ and $T_2$ satisfy a relation of $0.5 \leq T_2/T_1 \leq 3.0$.

3. The semiconductor element mounting board as claimed in claim 1, wherein an average thickness of the bonding agent layer is in the range of 5 to 50 μm.

4. The semiconductor element mounting board as claimed in claim 1, wherein in the case where an area of the first layer in a planar view thereof is defined as "100", an area of the semiconductor element in a planar view thereof is in the range of 6 to 10, and
wherein in the case where a volume of the first layer is defined as "100", a volume of the semiconductor element is in the range of 2 to 7.

5. The semiconductor element mounting board as claimed in claim 1, wherein a glass-transition temperature of the bonding agent layer is in the range of 0 to 180° C.

6. The semiconductor element mounting board as claimed in claim 1, wherein a coefficient of thermal expansion of the first layer in an inplane direction thereof measured based on JIS C 6481 at a temperature of 20° C. to a glass-transition temperature $Tg_b$ ° C. thereof, which is measured based on JIS C 6481, is in the range of 25 to 50 ppm/° C.

7. The semiconductor element mounting board as claimed in claim 1, wherein a Young's modulus of the first layer at 25° C. is in the range of 2 to 10 GPa.

8. The semiconductor element mounting board as claimed in claim 1, wherein a glass-transition temperature $Tg_b$ of the first layer, which is measured based on JIS C 6481, is in the range of 100 to 250° C.

9. The semiconductor element mounting board as claimed in claim 1, wherein in the case where a Young's modulus of the surface layer at 25° C. is defined as X GPa and a Young's modulus of the first layer at 25° C. is defined as Y GPa, X and Y satisfy a relation of $0.5 \leq X - Y \leq 13$.

10. The semiconductor element mounting board as claimed in claim 1, wherein a Young's modulus of the surface layer at 25° C. is in the range of 4 to 15 GPa.

11. The semiconductor element mounting board as claimed in claim 1, wherein in the case where a coefficient of thermal expansion of the surface layer in an inplane direction thereof measured based on JIS C 6481 at a temperature of 20° C. to a glass-transition temperature $Tg_a$ ° C. thereof, which is measured based on JIS C 6481, is defined as A ppm/° C. and a coefficient of thermal expansion of the first layer in an inplane direction thereof measured based on JIS C 6481 at a temperature of 20° C. to a glass-transition temperature $Tg_b$ ° C. thereof, which is measured based on JIS C 6481, is defined as B ppm/° C., A and B satisfy a relation of $0.5 \leq B-A \leq 50$.

12. The semiconductor element mounting board as claimed in claim 1, wherein a glass-transition temperature $Tg_a$ of the surface layer, which is measured based on JIS C 6481, is in the range of 100 to 300° C.

13. The semiconductor element mounting board as claimed in claim 1, wherein a Young's modulus of the board at 25° C. is in the range of 20 to 50 GPa.

14. The semiconductor element mounting board as claimed in claim 1, wherein a coefficient of thermal expansion of the board in an inplane direction thereof measured based on JIS C 6481 at a temperature of 20° C. to a glass-transition temperature $Tg_c$ ° C. thereof, which is measured based on JIS C 6481, is 13 ppm/° C. or lower.

15. The semiconductor element mounting board as claimed in claim 1, wherein the surface layer is mainly composed of a resin material containing cyanate resin and an inorganic filler.

16. The semiconductor element mounting board as claimed in claim 15, wherein an amount of the resin material contained in the surface layer is in the range of 30 to 70 wt %.

17. The semiconductor element mounting board as claimed in claim 15, wherein an amount of the inorganic filler contained in the surface layer is in the range of 5 to 40 wt %.

18. The semiconductor element mounting board as claimed in claim 15, wherein the resin material further contains epoxy resin, and
wherein in the case where an amount of the cyanate resin contained in the resin material is defined as C wt % and an amount of the epoxy resin contained in the resin material is defined as D wt %, C and D satisfy a relation of $0.5 \leq D/C \leq 4$.

19. The semiconductor element mounting board as claimed in claim 15, wherein the resin material further contains phenoxy resin, and
wherein in the case where an amount of the cyanate resin contained in the resin material is defined as C wt % and an amount of the phenoxy resin contained in the resin material is defined as E wt %, C and E satisfy a relation of $0.2 \leq E/C \leq 2$.

20. The semiconductor element mounting board as claimed in claim 1, wherein the (meth)acrylate copolymer is a (meth)acrylate copolymer obtained by polymerizing monomers each having a carboxyl group.

21. The semiconductor element mounting board as claimed in claim 1, wherein an amount of the epoxy resin contained in the resin composition is in the range of 10 to 100 parts by weight with respect to 10 parts by weight of the (meth)acrylate copolymer contained in the resin composition.

22. The semiconductor element mounting board as claimed in claim 1, wherein each of the monomers is a carboxyl methacrylate having the carboxyl group.

\* \* \* \* \*